(12) United States Patent
Nomoto et al.

(10) Patent No.: US 8,350,255 B2
(45) Date of Patent: Jan. 8, 2013

(54) THIN FILM TRANSISTOR AND METHOD FOR MANUFACTURING THIN FILM TRANSISTOR

(75) Inventors: Kazumasa Nomoto, Kanagawa (JP); Mao Katsuhara, Kanagawa (JP); Akira Yumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 182 days.

(21) Appl. No.: 12/757,605

(22) Filed: Apr. 9, 2010

(65) Prior Publication Data

US 2010/0264410 A1 Oct. 21, 2010

(30) Foreign Application Priority Data

Apr. 17, 2009 (JP) ................................. 2009-100434

(51) Int. Cl.
*H01L 51/00* (2006.01)
(52) U.S. Cl. ............ 257/40; 257/E51.005; 257/E51.006
(58) Field of Classification Search ..................... 257/40, 257/E51.005, E51.006
See application file for complete search history.

(56) References Cited

U.S. PATENT DOCUMENTS

| | | | | |
|---|---|---|---|---|
| 6,635,508 | B2 * | 10/2003 | Arai et al. | 438/99 |
| 7,679,085 | B2 * | 3/2010 | Jun et al. | 257/59 |
| 7,749,825 | B2 * | 7/2010 | Honda | 438/158 |
| 2006/0226420 | A1 * | 10/2006 | Nanai et al. | 257/40 |
| 2007/0069206 | A1 * | 3/2007 | Lee et al. | 257/40 |
| 2009/0045396 | A1 * | 2/2009 | Hahn et al. | 257/40 |

FOREIGN PATENT DOCUMENTS

JP 2006-216718 8/2006

\* cited by examiner

*Primary Examiner* — Victor A Mandala
(74) *Attorney, Agent, or Firm* — SNR Denton US LLP

(57) ABSTRACT

A method for manufacturing a thin film transistor includes the steps of covering a gate electrode patterned on a substrate with a gate insulating film, forming an organic semiconductor layer and an electrode film on the gate insulating film in that lamination order, and forming a negative type photoresist film on the substrate provided with the organic semiconductor layer and the electrode film and forming a resist pattern, which serves as a mask for forming a source-drain by etching the electrode film, through back surface exposure from the substrate side by using the gate electrode as a light-shielding mask and the following development treatment.

7 Claims, 21 Drawing Sheets

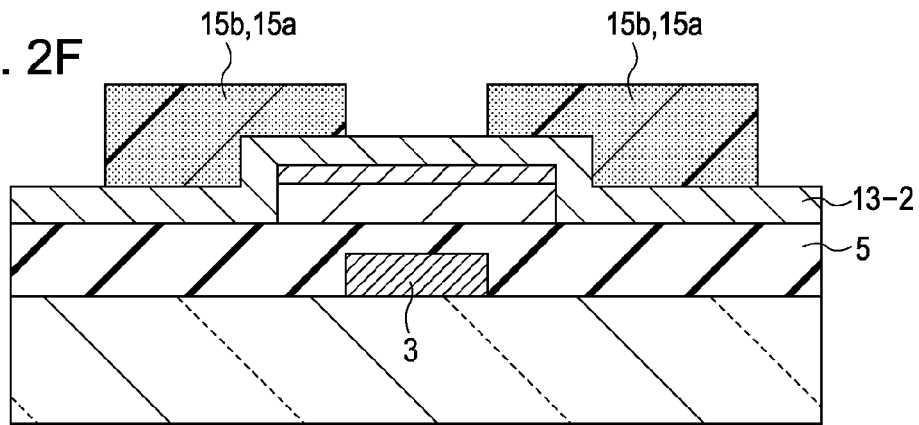
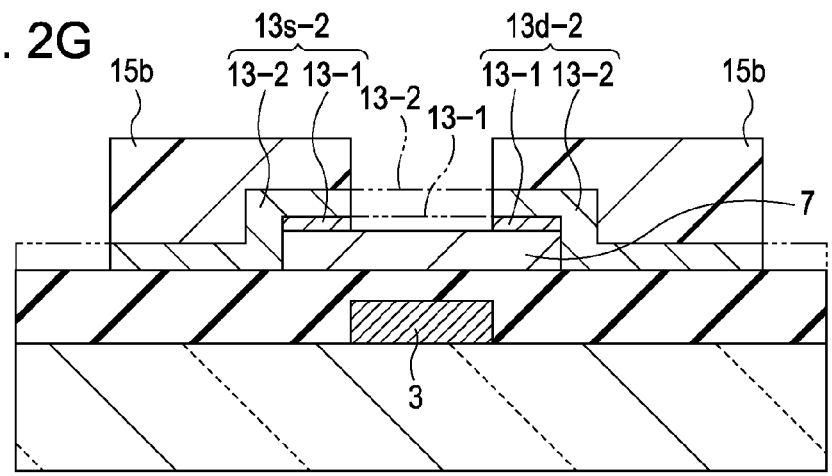
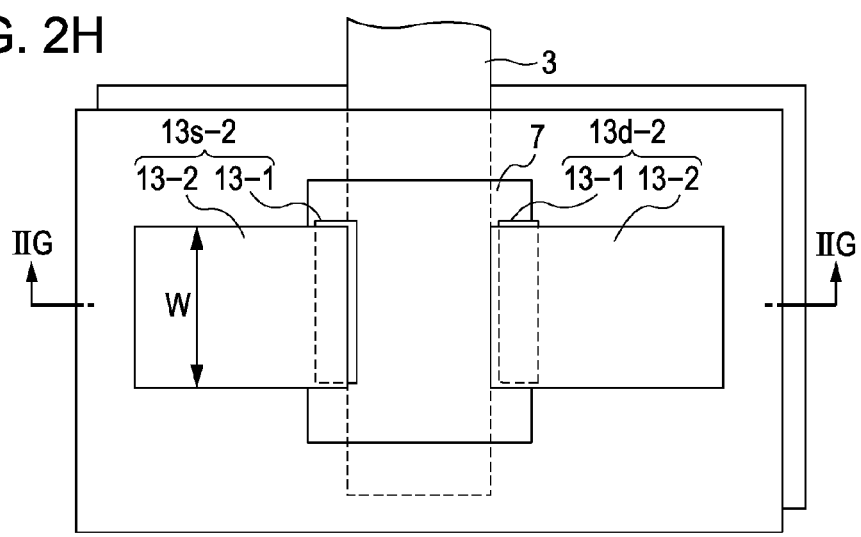

THIN FILM TRANSISTOR AND METHOD FOR MANUFACTURING THIN FILM TRANSISTOR

BACKGROUND OF THE INVENTION

1. Field of the Invention

The present invention relates to a thin film transistor and a method for manufacturing a thin film transistor. In particular, the present invention relates to a method for manufacturing a thin film transistor having a bottom gate-top contact structure including an organic semiconductor device and a thin film transistor obtained by this method.

2. Description of the Related Art

In recent years, a thin film transistor (TFT) including an organic semiconductor as a channel layer, that is, so-called an organic TFT, has been noted. The organic TFT has an advantage in cost reduction because a channel layer including an organic semiconductor can be formed through coating at low temperatures. In addition, formation can be conducted on a flexible substrate, e.g., plastic, exhibiting poor heat resistance. Regarding such an organic TFT, it is in the public domain that deterioration of characteristics due to a stress, e.g., heat, is suppressed by employing a bottom gate-top contact structure as compared with a bottom contact structure.

In production of the above-described organic TFT having the bottom gate-top contact structure, a method for patterning a source electrode and a drain electrode on an organic semiconductor pattern with high precision has been considered. For example, Japanese Unexamined Patent Application Publication No. 2006-216718 discloses a method for forming a source electrode and a drain electrode, wherein a transverse member is disposed dividing a space above a substrate into two, an organic semiconductor pattern is formed through evaporation from two directions and, thereafter, a metal material is evaporated in such a way as to divide with the transverse member.

SUMMARY OF THE INVENTION

Incidentally, in the thin film transistor having the bottom gate-top contact structure, an organic semiconductor layer is held between layers of a source-drain and a gate electrode. Consequently, a parasitic capacitance is generated at a portion where the source-drain overlaps the gate electrode, and increases or variations in operation voltage and a reduction in operation speed tend to occur, so as to cause demerits, e.g., provision of a compensation circuit to compensate them.

However, the minimum working size and the registration accuracy of film formation through evaporation by using a general stencil mask are about 20 µm. In particular, regarding a large area process, the registration accuracy varies in the substrate surface and, therefore, it is difficult to effectively suppress an occurrence of the above-described parasitic capacitance. The same goes for the method in Japanese Unexamined Patent Application Publication No. 2006-216718 cited above.

Accordingly, it is desirable to provide a method for manufacturing a thin film transistor, wherein a parasitic capacitance between a source-drain and an electrode can be suppressed effectively in a bottom gate-top contact structure, and provide a thin film transistor obtained by this method.

A method for manufacturing a thin film transistor according to an embodiment of the present invention includes the steps of covering a gate electrode patterned on a substrate with a gate insulating film, forming an organic semiconductor layer and an electrode film on the gate insulating film in that lamination order, and forming a negative type photoresist film on the substrate provided with the organic semiconductor layer and the electrode film and forming a resist pattern, which serves as a mask for forming a source-drain by etching the electrode film, through back surface exposure from the substrate side by using the gate electrode as a light-shielding mask and the following development treatment.

A thin film transistor having the configuration according to an embodiment of the present invention, as described below, is obtained by such a manufacturing method. That is, the thin film transistor according to an embodiment of the present invention includes a gate electrode disposed on a substrate and a gate insulating film covering the gate electrode, an organic semiconductor layer disposed on the gate insulating film, and a source-drain disposed on the organic semiconductor layer while end edges thereof are allowed to agree with two end edges of the gate electrode in the width direction.

According to the above-described configuration, the source-drain is disposed on the gate insulating film covering the gate electrode while being registered with respect to the gate electrode through self alignment.

As described above, according to an embodiment of the present invention, since the source-drain is disposed while being registered with respect to the gate electrode through self alignment, a parasitic capacitance between the source-drain and the gate electrode can be suppressed effectively in the thin film transistor having the bottom gate-top contact structure.

BRIEF DESCRIPTION OF THE DRAWINGS

FIGS. 2A to 2J are step diagrams for explaining a manufacturing method according to a second embodiment;

DESCRIPTION OF THE PREFERRED EMBODIMENTS

The embodiments according to the present invention will be described below with reference to the drawings. Explanations will be made in the following order.

1. First embodiment (example in which source electrode and drain electrode have single-layer structures)
2. Second embodiment (example in which source electrode and drain electrode have laminated structures)
3. Third embodiment (example in which source electrode and drain electrode also serve as a part of wirings)
4. Fourth embodiment (example in which source electrode and drain electrode have laminated structures and also serve as a part of wirings)
5. Fifth embodiment (example in which wirings overlap a part of source electrode and drain electrode)

In the first embodiment to the fifth embodiment, methods for manufacturing the thin film transistors will be explained and, then, the configurations of the resulting thin film transistors will be explained.

1. First Embodiment

Figure 1A:
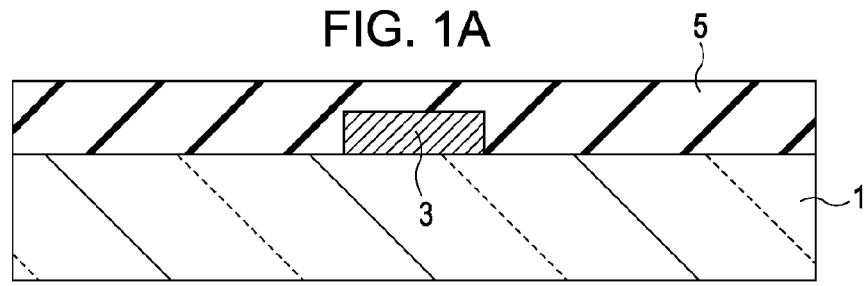
FIGS. 1A to 1N are step diagrams for explaining a manufacturing method according to a first embodiment.
Figure 1B:
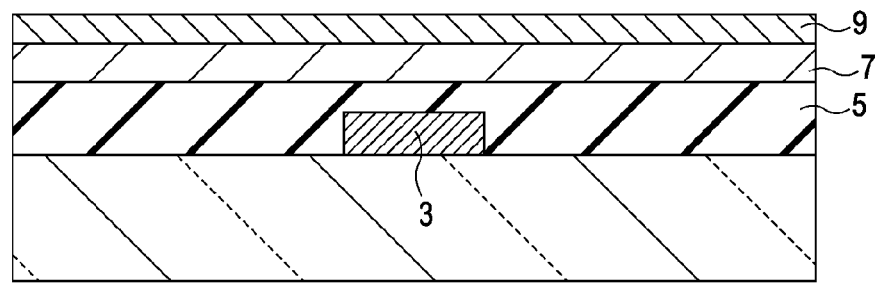
Figure 1C:
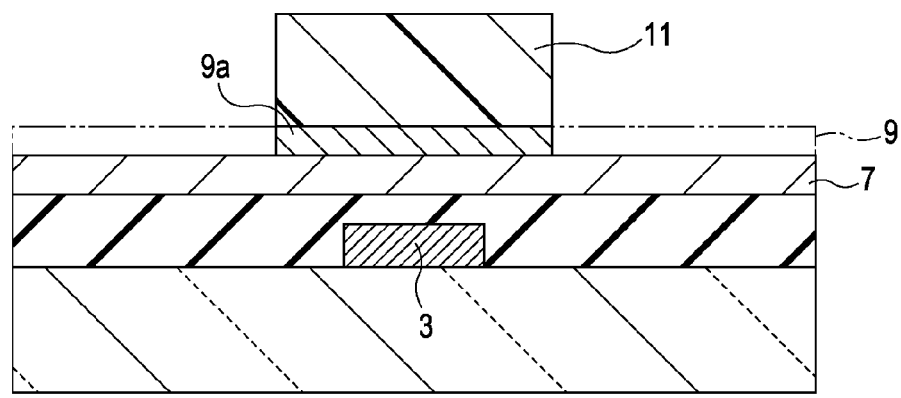
Figure 1D:
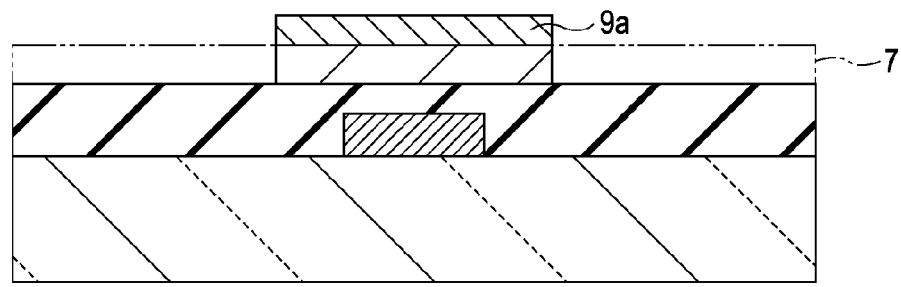
Figure 1E:
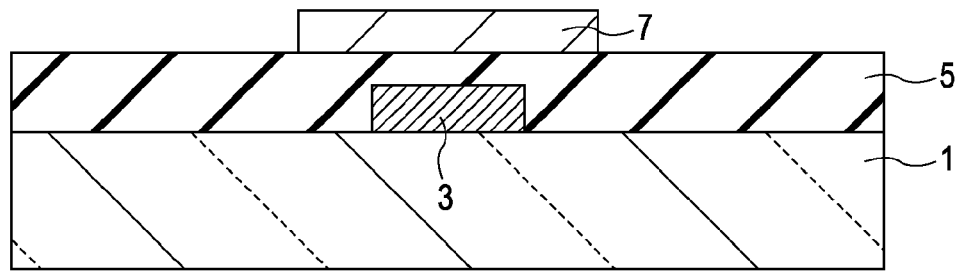
Figure 1F:
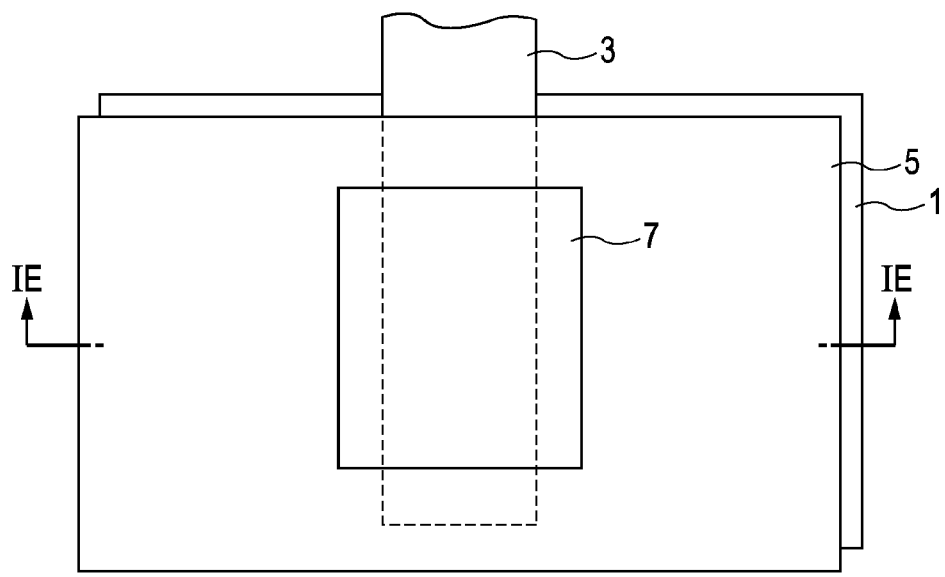
Figure 1G:
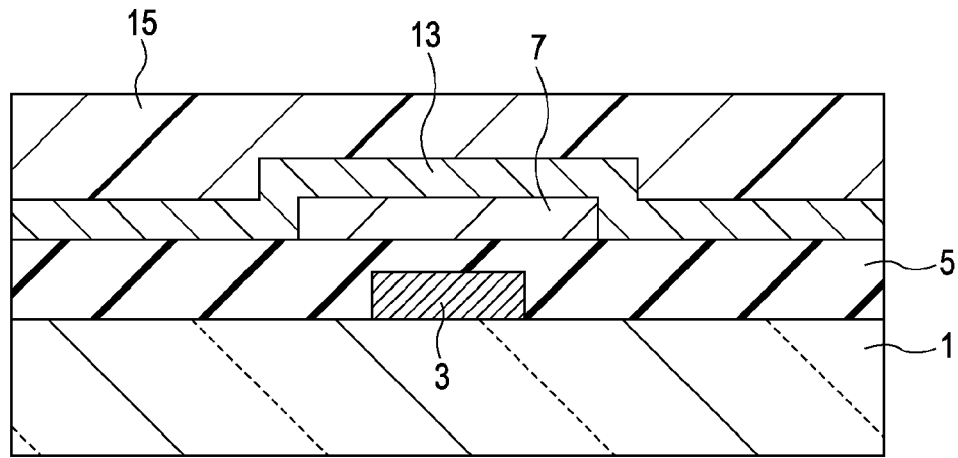
Figure 1H:
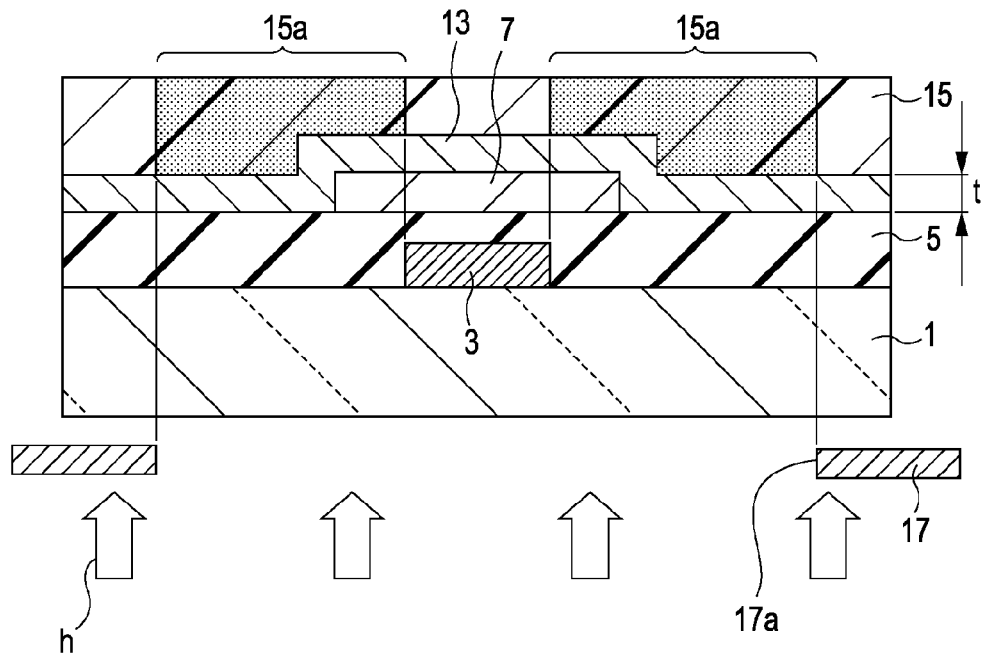
Figure 1I:
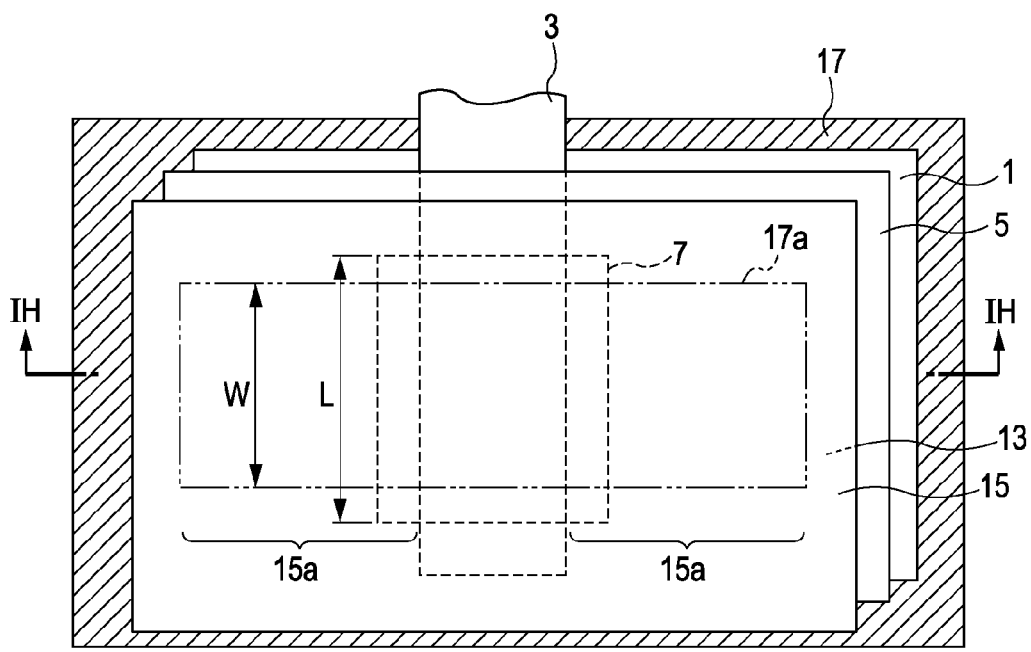
Figure 1J:
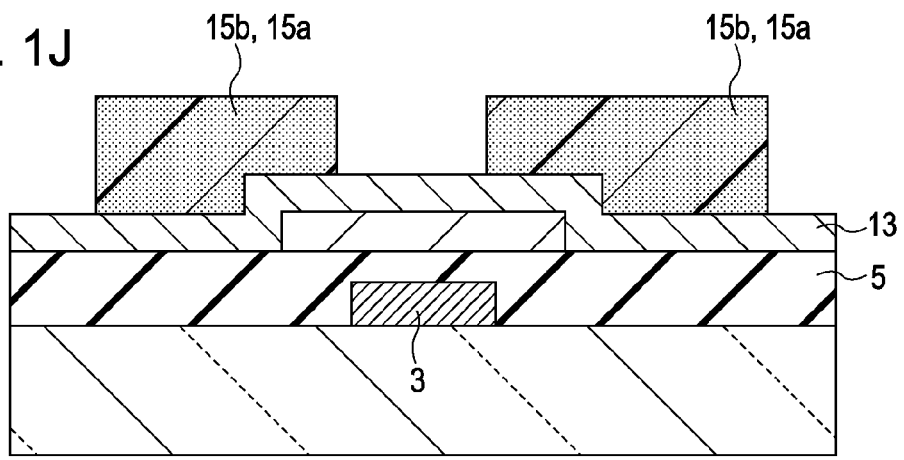
Figure 1K:
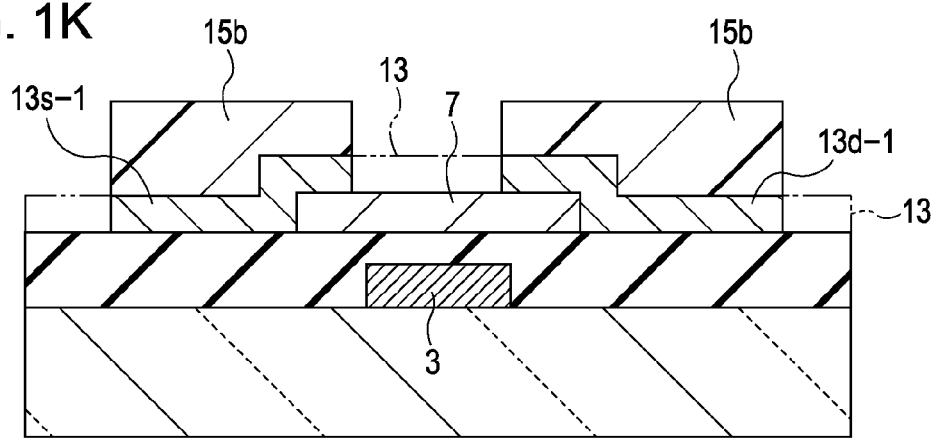
Figure 1L:
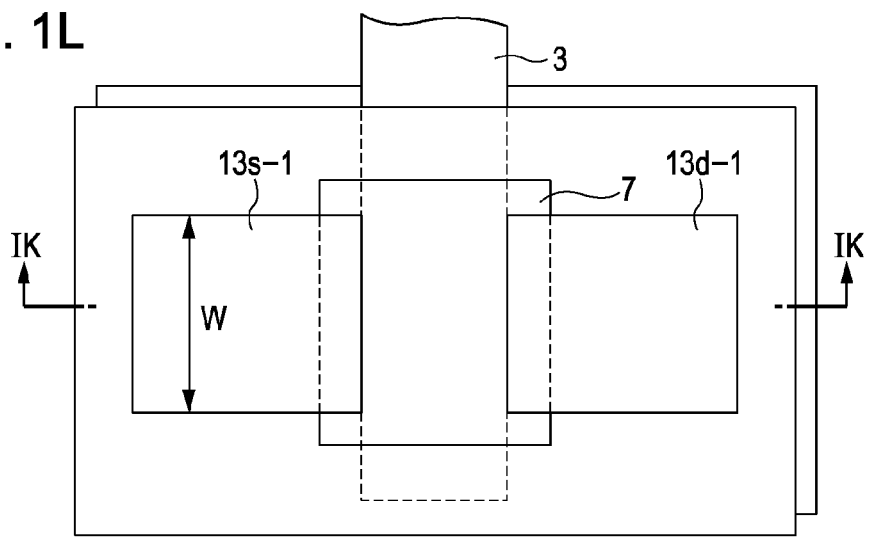
Figure 1M:
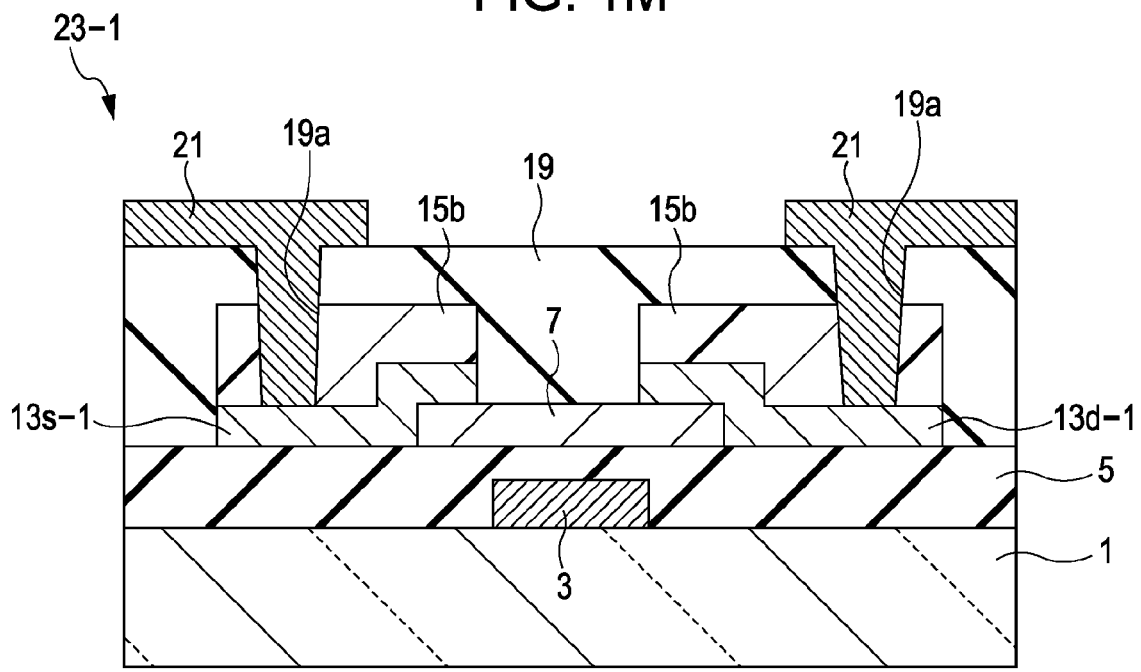
Figure 1N:
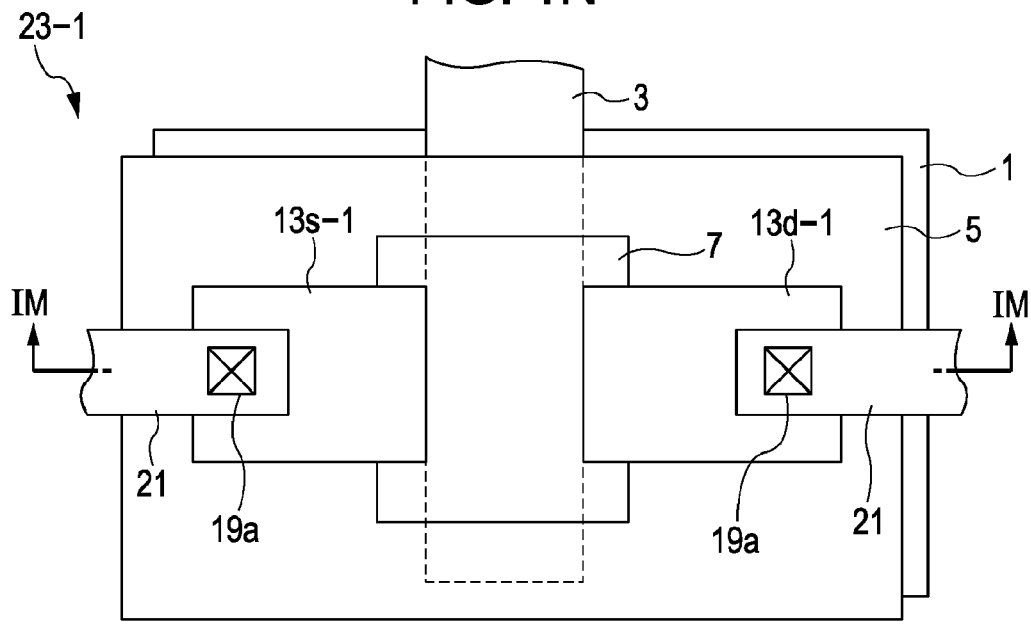

FIGS. 1A to 1N are step diagrams for explaining a first embodiment according to the present invention. A method for manufacturing a thin film transistor according to the first embodiment will be described below with reference to these drawings.

Initially, as shown in FIG. 1A, a gate electrode 3 having a light-shielding property is patterned on a substrate 1 having a light-transmitting property with respect to exposure light, and a gate insulating film 5 having a light-transmitting property is formed while covering them.

It is important that the substrate 1 is formed from a light-transmitting material. Examples of such a substrate 1 include transparent substrates, e.g., glass and plastic, and substrates, in which a barrier layer and a buffer layer against water vapor and oxygen, as necessary, are disposed on a transparent substrate having a multilayer structure thereof.

It is important that the gate electrode 3 has a light-shielding property. Such a gate electrode 3 is formed from Al, AlNd, Cu, Au, Ni, W, Mo, Cr, Ti, Ta, Ag, or the like or a multilayer film thereof. A method for manufacturing the above-described gate electrode 3 is not specifically limited.

As an example of methods for forming the gate electrode 3, it is possible that after the above-described metal material film is formed, etching is conducted by using a resist as a mask. The film formation of the metal material film is conducted by an evaporation method, a sputtering method, a plating method, or the like. Alternatively, a film of electrically conductive ink including metal fine particles, e.g., Au nanoparticles or Ag nanoparticles, may be formed by a coating method. As for the method for forming a resist pattern, a photolithography method or a printing method may be used.

As for another example of the methods for forming the gate electrode 3, the electrically conductive ink including metal fine particles, e.g., Au nanoparticles or Ag nanoparticles, may be patterned directly by the printing method.

In this regard, examples of the above-described coating methods include a spin coating method, an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, a calender coater method, and a dipping method. The same goes for the following embodiments.

Furthermore, examples of the above-described printing methods include screen printing, ink-jet printing, relief printing, planographic printing, and intaglio printing, and printing methods through combination thereof. The same goes for the following embodiments.

It is important that the gate insulating film 5 has a light-transmitting property. Such a gate insulating film 5 is formed from an inorganic material or an organic material. The gate insulating film 5 formed from an inorganic material, e.g., silicon dioxide, silicon nitride, TaOx, HfOx, and AlOx may be formed by a sputtering method, a CVD method, an RECVD method, or the like. On the other hand, the gate insulating film formed from an organic material, e.g., polyvinyl phenol, PMMA, polyimide, or fluororesin, may be formed by a coating method. Alternatively, the gate insulating film 5 formed from an organic polymer material may be formed by a printing method.

Subsequently, as shown in FIG. 1B, an organic semiconductor layer 7 having a light-transmitting property with respect to exposure light is formed on the gate insulating film 5.

Examples of the materials constituting the above-described described organic semiconductor layer 7 include the following materials.

Polypyrrole and substitution products of polypyrrole,
Polythiophene and polythiophene derivatives,
Isothianaphthenes, e.g., polyisothianaphthene,
Thienylene vinylenes, e.g., polythienylene vinylene,
Poly(p-phenylene vinylene)s, e.g., poly(p-phenylene vinylene)
Polyaniline and polyaniline derivatives,
Polyacetylenes,
Polydiacetylenes,
Polyazulenes,
Polypyrenes,
Polycarbazoles,
Polyselenophenes,
Polyfuranes,
Poly(p-phenylene)s,
Polyindoles
Polypyridazines,
Acenes, e.g., naphthacene, pentacene, hexacene, heptacene, dibenzopentacene, tetrabenzopentacene, pyrene, dibenzopyrene, chrysene, perylene, coronene, terylene, ovalene, quaterrylene, and circumanthracene,
Derivatives in which a part of carbon of acenes are substituted with atoms, e.g., N, S, and O, or functional groups, e.g., a carbonyl group (for example, triphenodioxazine, triphenodithiazine, hexacene-6,15-quinone, TIPS pentacene, TES-anthradithiophene, and the like, polymers, e.g., polyvinyl carbazole, polyphenylene sulfide, and polyvinylene sulfide, and polycyclic condensates),
Oligomers having the same repetition units as those of the above-described polymers,
Metal phthalocyanines,
Tetrathiafulvalene and tetrathiafulvalene derivatives,
Tetrathiapentalene and tetrathiapentalene derivatives,
Naphthalene-1,4,5,8-tetracarboxylic acid diimide, N,N'-bis(4-trifluoromethylbenzyl)naphthalene-1,4,5,8-tetracarboxylic acid diimide, N,N'-bis(1H,1H-perfluorooctyl), N,N'-bis(1H,1H-perfluorobutyl), and N,N'-dioctylnaphthalene-1,4,5,8-tetracarboxylic acid diimide derivatives,
Naphthalene tetracarboxylic acid diimides, e.g., naphthalene-2,3,6,7-tetracarboxylic acid diimide,
Condensed ring tetracarboxylic acid diimides of anthracene tetracarboxylic acid diimides, e.g., anthracene-2,3,6,7-tetracarboxylic acid diimide,
Fullerenes, e.g., C60, C70, C76, C78, and C84,
Carbon nanotubes, e.g., SWNT, and
Colorants, e.g., merocyanine colorants and hemicyanine colorants Regarding film formation of the organic semiconductor layer 7 formed from the above-described material, a film of the material having a sublimation point may be formed through evaporation. In the case where a solution is formed through dissolution into a solvent, film formation may be conducted by a coating method or a printing method.

Then, a protective film 9 in patterning of the resulting organic semiconductor layer 7 is formed on the organic semiconductor layer 7. The protective film 9 is formed from a metal material, an oxide, or the like and not necessarily has a light-transmitting property. This protective film 9 is formed by using, for example, a metal material. Examples of metal materials constituting the protective film 9 include gold (Au), platinum (Pt), palladium (Pd), silver (Ag), tungsten (W), tantalum (Ta), molybdenum (Mo), aluminum (Al), chromium (Cr), titanium (Ti), copper (Cu), nickel (Ni), indium (In), tin (Sn), manganese (Mn), ruthenium (Rh), rubidium (Rb), and compounds thereof. In this regard, the protective film 9 may be formed by laminating the above-described materials.

Next, as shown in FIG. 1C, a resist pattern 11 is formed on the protective film 9 at a location overlapping the gate electrode 3. The formation of the resist pattern 11 is conducted by applying the photolithography method or the printing method. As for the printing method, ink-jet printing, screen printing, offset printing, gravure printing, flexographic printing, microcontact printing, or the like may be used. In this regard, in the formation of the resist pattern 11, the organic semiconductor layer 7 is protected by the protective film 9.

Subsequently, the protective film 9 is etched by using the resist pattern 11 as a mask. In this manner, a protective film pattern 9a is formed on the organic semiconductor layer 7.

Then, as shown in FIG. 1D, the organic semiconductor layer 7 is etched by using the protective film pattern 9a as a mask, so that the organic semiconductor is patterned while covering a part of a portion above the gate electrode 3 along the direction of width of the gate electrode 3. Here, dry etching or wet etching with a solvent to dissolve the semiconductor is conducted. Element separation of semiconductors formed here is conducted with this.

Thereafter, the protective film pattern 9a is removed through peeling. The peeling and removal of the protective film pattern 9a is conducted through wet etching. As for an etching solution at this time, for example, a solution containing an acid, e.g., nitric acid, sulfuric acid, hydrochloric acid, acetic acid, oxalic acid, hydrofluoric acid, or hydrogen peroxide, a salt, e.g., ammonium fluoride, potassium iodide, permanganate, or dichromate, or a mixture solution thereof is used. It is preferable that the concentration of the acid in the etching solution is 20% or less in order to suppress damage to the organic semiconductor layer 7. Furthermore, additives, e.g., an organic nitrogen compound and the like may be added in order to ensure a stable etching rate. In this regard, the patterning of the organic semiconductor layer 7 on the gate insulating film 5 may be patterning by applying a printing method. In this case, the patterning by the above-described etching process is not necessary.

In this manner, the configuration indicated by a sectional view shown in FIG. 1E of the section taken along a line IE-IE in FIG. 1F and a plan view shown in FIG. 1F is obtained, wherein the gate insulating film 5 is disposed while covering the gate electrode 3 on the substrate 1, and the island-shaped organic semiconductor layer 7 is patterned on the gate insulating film 5.

Next, as shown in FIG. 1G, an electrode film 13 having a light-transmitting property is formed all over the surface of the gate insulating film 5 while covering the organic semiconductor layer 7 patterned as described above. Furthermore, a negative type photoresist film 15 is formed on the electrode film 13.

Regarding the electrode film 13, in the case where a thin film transistor produced here is of p-type channel, an electrically conductive material, e.g., Au, Pt, Pd, Cu, CuOx, ITO, ZnO, or Ag nanoparticles, having a large work function is used favorably for at least a layer on the side in contact with the organic semiconductor layer 7. Furthermore, another metal material may be formed on the above-described material layer. On the other hand, in the case where a thin film transistor produced here is of n-type channel, Mg, Ag, Ca, or a compound thereof is used favorably for at least the layer on the side in contact with the organic semiconductor layer 7. However, these materials are oxidized in the air easily. Therefore, it is necessary that a film of another metal is formed thereon so as to cover the material.

It is important that the electrode film 13 formed from the above-described material has a light-transmitting property with respect to exposure light. Consequently, in particular, the film thickness of the electrode film 13 is suppressed to a value, at which UV light used as the exposure light can be transmitted, and is specified to be 1 nm to 50 nm typically.

The resist film 15 has at least negative type photosensitivity.

In the configuration obtained up to this point, it is important that regarding the layers under the resist film 15, every layer of from the substrate 1 to the electrode film 13, excluding the gate electrode 3, has a light-transmitting property with respect to the exposure light, and the exposure light can be transmitted through the whole layer in which these layers are totalized. In this regard, the exposure light refers to the light used in the photolithography conducted for the next step and is specified to be, for example, ultraviolet light (UV).

Next, as indicated by a sectional view shown in FIG. 1H of the section taken along a line IH-IH in FIG. 1I and a plan view shown in FIG. 1I, back surface exposure is conducted, in which the UV light as the exposure light h from the substrate 1 side is applied to the resist film 15. At this time, an exposure mask 17 is disposed on the substrate 1 side, and the exposure light h is applied through this exposure mask 17.

The exposure mask 17 is provided with an opening portion 17a intersecting the gate electrode 3. This opening portion 17a is configured in such a way that the exposure light h is applied to both sides of the gate electrode 3. As shown in the drawings, in the case where the opening portion 17a is disposed within the range of the organic semiconductor layer 7 in the extension direction of the gate electrode 3, the opening width of this opening portion 17a corresponds to the gate width W. This is preferable because the dimension controllability of the gate width W is good. On the other hand, in the case where the opening portion 17a is disposed exceeding the range of the organic semiconductor layer 7 in the extension direction of the gate electrode 3, the dimension L of the organic semiconductor layer 7 corresponds to the gate width.

In the opening portion 17a of the exposure mask 17, the exposure light h is applied to a portion, which is not light-shielded with the gate electrode 13, of the resist film 15 on the basis of the above-described back surface exposure through the exposure mask 17, so that exposed portions 15a result and the resist material is cured.

Thereafter, as shown in FIG. 1J, a development treatment of the resist film 15 is conducted and, thereby, merely the exposed portions 15a serving as resist patterns 15b are left on the electrode film 13. The resulting resist patterns 15b are developed through self alignment with respect to the gate electrode 3.

The accuracy of in-plane agreement between the end edge of the gate electrode 3 and the end edge of the resist pattern 15b depends on the amount of UV irradiation to the resist film 15, the shape of the gate electrode 3, the amount of diffraction of the exposure light h depending on the film thickness of the gate insulating film 5, and the like. For example, in the case where the film thickness of the gate electrode 3 is specified to be 300 nm and the film thickness of the gate insulating film 5 is specified to be 500 nm, typically, the accuracy of in-plane agreement may be controlled at 3 μm or less. It is difficult to realize this accuracy regarding pattern film formation by using an evaporation mask and, in addition, in the case where a substrate 1 formed from plastic is used, it is difficult to realize this accuracy regarding even common photolithography from a surface side because of shrinkage of the substrate 1 during the steps.

Next, as indicated by a sectional view shown in FIG. 1K of the section taken along a line IK-IK in FIG. 1L and a plan view shown in FIG. 1L, pattern etching of the electrode film 13 is conducted by using the resist patterns 15b as masks. In this manner, the electrode film 13 on the gate electrode 3 is removed through etching, and a source 13s-1 and a drain 13d-1 are formed from the electrode film 13 through self alignment with respect to the gate electrode 3.

Regarding the above-described pattern etching of the electrode film 13, for example, in the case where the organic semiconductor layer 7 is formed from pentacene and the electrode film 13 is formed from Au, it is possible to conduct wet etching by using an etching solution containing iodine and potassium iodine as bases.

Thereafter, as indicated by a sectional view shown in FIG. 1M of the section taken along a line IM-IM in FIG. 1N and a plan view shown in FIG. 1N, an interlayer insulating film 19 is formed on the substrate 1 provided with the source 13s-1 and the drain 13d-1. At this time, the resist patterns 15b are not necessarily removed, but may be left as-is so as to be covered with the interlayer insulating film 19. Subsequently, individual connection holes 19a reaching the source 13s-1 and the drain 13d-1 are formed in the interlayer insulating film 19 and the resist patterns 15b. Then, individual wirings 21 connected to the source 13s-1 and the drain 13d-1 through the connection holes 19a are formed on the interlayer insulating film 19, so as to complete a thin film transistor 23-1.

Regarding the formation of the connection holes 19a, in the case where the interlayer insulating film 19 is a layer formed from a photosensitive resin material (for example, photosensitive PVA), connection holes are formed in the interlayer insulating film 19 through exposure and development and, furthermore, the connection holes 19a are formed by etching the resist patterns 15b. Alternatively, in the case where the interlayer insulating film 19 is a layer formed from a non-photosensitive resin material (fluororesin or polyparaxylylene), connection holes 19a are formed through photolithography and oxygen plasma RIE.

Formation of the wirings 21 is conducted through film formation and pattern etching of the wiring material or by applying the printing method. For example, in the case where the thin film transistor produced here is used as a switching transistor of an active matrix circuit, any one of the two wirings 21 is extended to a data line and the other wiring is extended to an electrode of a storage capacitor. In this case, the gate electrode 3 is extended to a scanning line.

The thin film transistor 23-1 obtained as described above has a bottom gate-top contact structure, in which the organic semiconductor layer 7 is disposed on the gate insulating film 5 covering the gate electrode 3 and the source 13s-1 and the drain 13d-1 are disposed while a part thereof are laminated on the organic semiconductor layer 7. Furthermore, in this thin film transistor 23-1, the source 13s-1 and the drain 13d-1 are disposed while being led from on the patterned organic semiconductor layer 7 to on the gate insulating film 5.

In particular, the source 13s-1 and the drain 13d-1 have pattern shapes obtained through back surface exposure from the substrate 1 side by using the gate electrode 3 as the mask. Consequently, the source 13s-1 and the drain 13d-1 are registered with respect to the gate electrode 3 through self alignment while end edges thereof are allowed to agree with two end edges of the gate electrode 3 in the width direction.

Furthermore, a feature of the above-described thin film transistor 23-1 is that individual layers of from the substrate 1 to the electrode film 13 constituting the source 13s-1 and the drain 13d-1, excluding the gate electrode 3, have a light-transmitting property in order to conduct the above-described back surface exposure.

Moreover, it is also a feature that the resist patterns 15b left on the source 13s-1 and the drain 13d-1 are negative resists having the same pattern shapes as those of the source 13s-1 and the drain 13d-1.

According to the above-described first embodiment, the source 13s-1 and the drain 13d-1 are disposed, which are registered with respect to the gate electrode 3 through self alignment while end edges thereof are allowed to agree with two end edges of the gate electrode 3 in the width direction. Consequently, a parasitic capacitance between the source 13s-1 and drain 13d-1 and the gate electrode 3 can be suppressed effectively in the thin film transistor having the bottom gate-top contact structure.

2. Second Embodiment

FIGS. 2A to 2J are step diagrams for explaining a second embodiment according to the present invention. A method for manufacturing a thin film transistor according to the second embodiment will be described below with reference to these drawings. In this regard, detailed explanations of the same configurations as those in the first embodiment will not be provided.

Figure 2A:
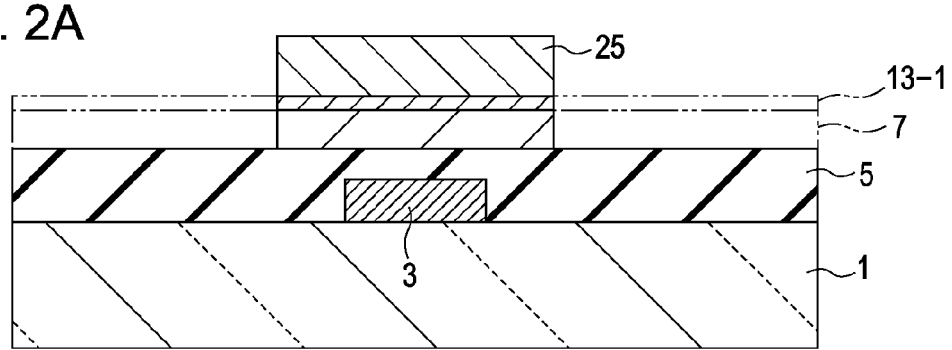
Figure 2B:
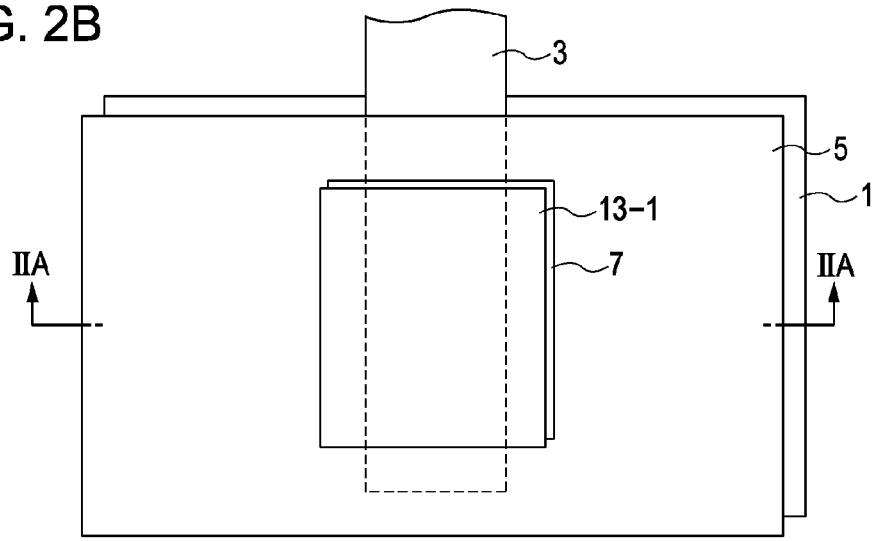

Initially, as indicated by a sectional view shown in FIG. 2A of the section taken along a line IIA-IIA in FIG. 2B and a plan view shown in FIG. 2B, a gate electrode 3 having a light-shielding property is patterned on a substrate 1 having a light-transmitting property with respect to exposure light, and a gate insulating film 5 and an organic semiconductor layer 7, which have a light-transmitting property, are formed while covering them. The procedure up to this point is conducted in a manner similar to that in the first embodiment, and the materials used for the individual layers are the same as those described above.

Subsequently, a first electrode film 13-1 having a light-transmitting property with respect to the exposure light is formed on the resulting organic semiconductor layer 7. This first electrode film 13-1 is a layer serving as a protective film of the organic semiconductor layer 7 and is a layer left as-is to serve as a constituent of a thin film transistor.

As for the above-described first electrode film 13-1, in the case where the thin film transistor produced here is of p-type channel, an electrically conductive material, e.g., Au, Pt, Pd, Cu, CuOx, ITO, ZnO, or Ag nanoparticles, having a large work function or an acceptor material, e.g., TCNQ or silver chloride, is used favorably. On the other hand, in the case where the thin film transistor produced here is of n-type channel, Mg, Ag, Ca, or a compound thereof is used favorably. However, these materials are oxidized in the air easily. Therefore, it is necessary that a film of another metal is formed thereon so as to cover the material.

Thereafter, a resist pattern 25 is formed on the first electrode film 13-1, and the first electrode film 13-1 is etched by using the resist pattern 25 as a mask. Then, the resist pattern 25 is peeled and the organic semiconductor layer 7 is patterned into the shape of an island by using the first electrode film 13-1 as a mask.

Figure 2C:
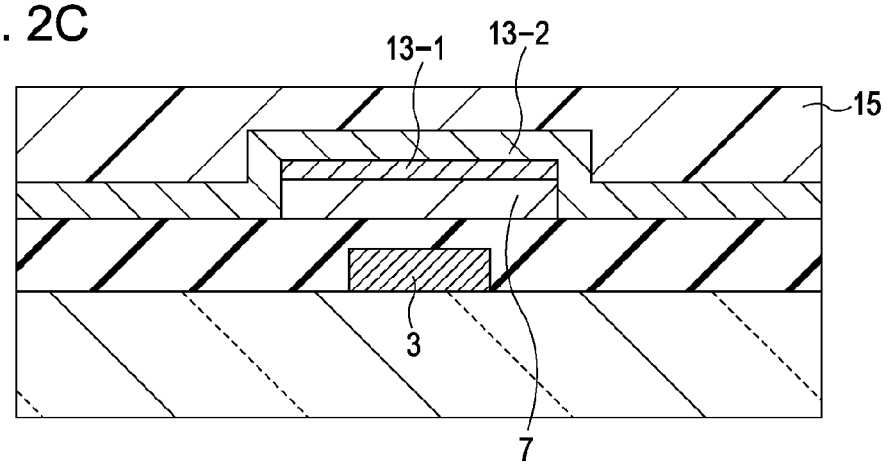

Next, as shown in FIG. 2C, a second electrode film 13-2 having a light-transmitting property is formed all over the surface of the gate insulating film 5 while covering the island-shaped organic semiconductor layer 7 and the first electrode film 13-1. Furthermore, a negative type photoresist film 15 is formed on the second electrode film 13-2.

The second electrode film 13-2 formed here is not necessarily a material capable of injecting charge into the organic semiconductor layer 7, but a more inexpensive electrically conductive material or a highly electrically conductive material may be used. At this time, it is necessary that the first electrode film 13-1 and the second electrode film 13-2 have a light-transmitting property as a whole, and typically, the total film thickness is specified to be 1 nm to 50 nm.

The resist film 15 has at least negative type photosensitivity, as in the first embodiment.

In the configuration obtained up to this point, it is a feature that regarding the layers under the resist film 15, every layer of from the substrate 1 to the second electrode film 13-2, excluding the gate electrode 3, has a light-transmitting property with respect to the exposure light, and the exposure light can be transmitted through the whole layer in which these layers are totalized.

Thereafter, the same procedure as that in the first embodiment may be conducted as described below.

Figure 2D:
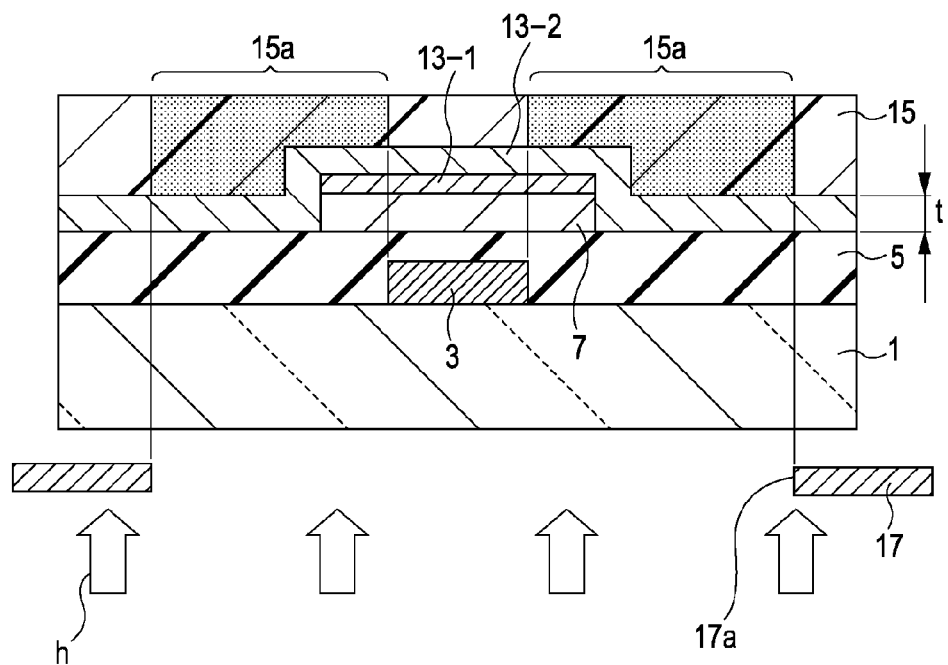
Figure 2E:
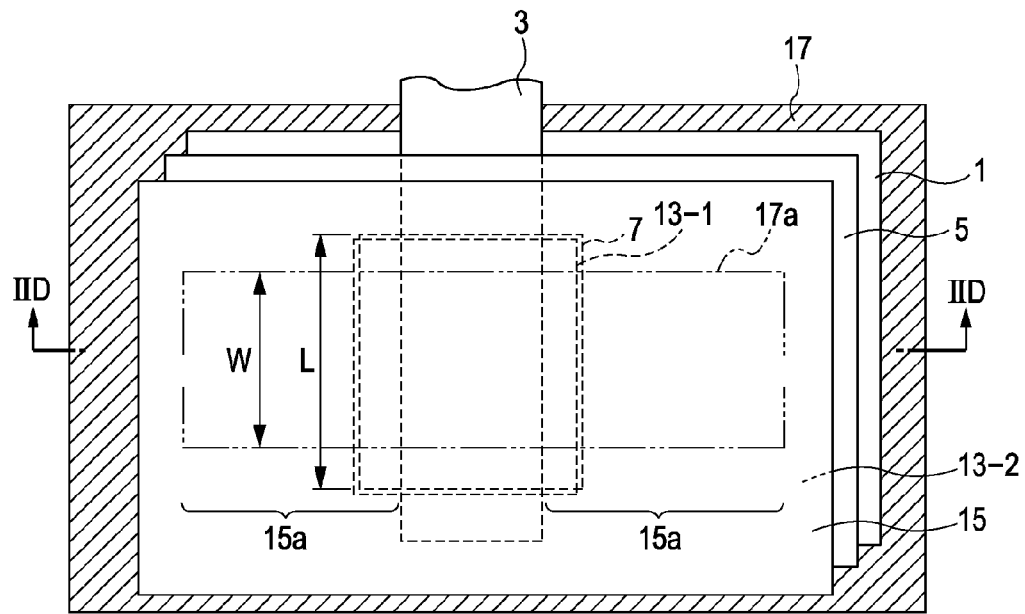

Initially, as indicated by a sectional view shown in FIG. 2D of the section taken along a line IID-IID in FIG. 2E and a plan view shown in FIG. 2E, back surface exposure is conducted, in which the UV light as the exposure light h from the substrate 1 side is applied to the resist film 15. At this time, an exposure mask 17 is disposed on the substrate 1 side, and the exposure light h is applied through this exposure mask 17. The exposure mask 17 is provided with an opening portion 17a intersecting the gate electrode 3, as in the first embodiment.

In the opening portion 17a of the exposure mask 17, the exposure light h is applied to a portion, which is not light-shielded with the gate electrode 13, of the resist film 15 on the basis of the above-described back surface exposure through the exposure mask 17, so that exposed portions 15a result and the resist material of the exposed portions 15a is cured.

Thereafter, as shown in FIG. 2F, a development treatment of the resist film 15 is conducted and, thereby, merely the exposed portions 15a serving as resist patterns 15b are left on the second electrode film 13-2. The resulting resist patterns 15b are developed through self alignment with respect to the gate electrode 3, as in the first embodiment.

Next, as indicated by a sectional view shown in FIG. 2G of the section taken along a line IIG-IIG in FIG. 2H and a plan view shown in FIG. 2H, pattern etching of the first electrode film 13-1 and the second electrode film 13-2 is conducted by using the resist patterns 15b as masks. In this manner, the second electrode film 13-2 and the first electrode film 13-1 on the gate electrode 3 is removed through etching, and a source 13s-2 and a drain 13d-2 are formed from the second electrode film 13-2 and the first electrode film 13-1 through self alignment with respect to the gate electrode 3.

Figure 2I:
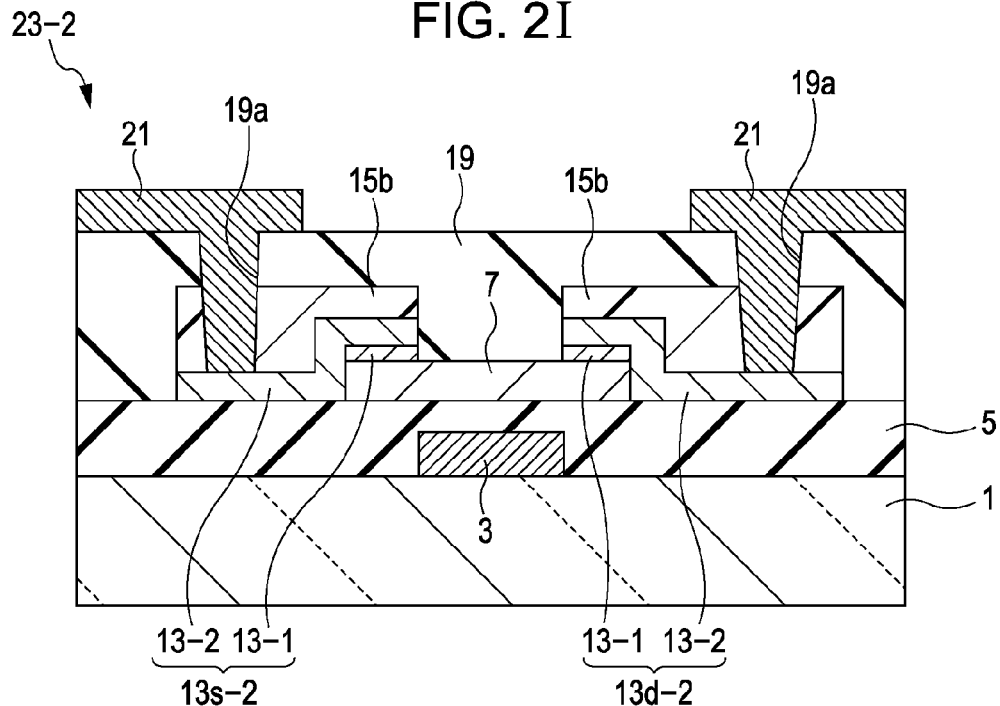
Figure 2J:
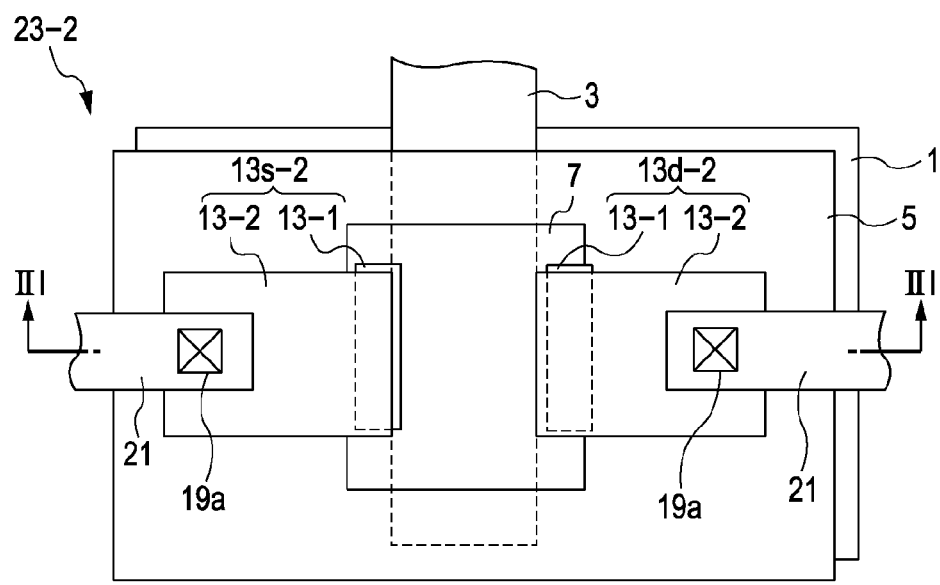

Thereafter, as indicated by a sectional view shown in FIG. 2I of the section taken along a line III-III in FIG. 2J and a plan view shown in FIG. 2J, an interlayer insulating film 19 is formed on the substrate 1 provided with the source 13s-2 and the drain 13d-2, and individual connection holes 19a reaching the source 13s-2 and the drain 13d-2 are formed. Then, individual wirings 21 connected to the source 13s-2 and the drain 13d-2 through the connection holes 19a are formed on the interlayer insulating film 19, so as to complete a thin film transistor 23-2.

The thin film transistor 23-2 obtained as described above is different from the thin film transistor of the first embodiment in that the source 13s-2 and the drain 13d-2 on the organic semiconductor layer 7 have a laminated structure of the first electrode film 13-1 and the second electrode film 13-2. Other configurations are the same.

Therefore, in the above-described second embodiment as well, the source 13s-2 and the drain 13d-2 are disposed, which are registered with respect to the gate electrode 3 through self alignment while end edges thereof are allowed to agree with two end edges of the gate electrode 3 in the width direction. Consequently, as in the first embodiment, a parasitic capacitance between the source 13s-2 and drain 13d-2 and the gate electrode 3 may be suppressed effectively in the thin film transistor having the bottom gate-top contact structure.

Furthermore, the source 13s-2 and the drain 13d-2 on the organic semiconductor layer 7 have a laminated structure of the first electrode film 13-1 and the second electrode film 13-2. Consequently, in the case where a material capable of injecting charge into the organic semiconductor layer 7 is used for the first electrode film 13-1, an inexpensive material may be used for the second electrode film 13-2, so that a cost reduction may be facilitated. Moreover, as shown in FIG. 2A, the first electrode film 13-1 serves as the protective film in patterning of the organic semiconductor layer 7. Therefore, the film quality of the organic semiconductor layer 7 is maintained and the transistor characteristics may be ensured.

3. Third Embodiment

FIGS. 3A to 3J are step diagrams for explaining a third embodiment according to the present invention. A method for manufacturing a thin film transistor according to the third embodiment will be described below with reference to these drawings. In this regard, detailed explanations of the same configurations as those in the first embodiment will not be provided.

Figure 3A:
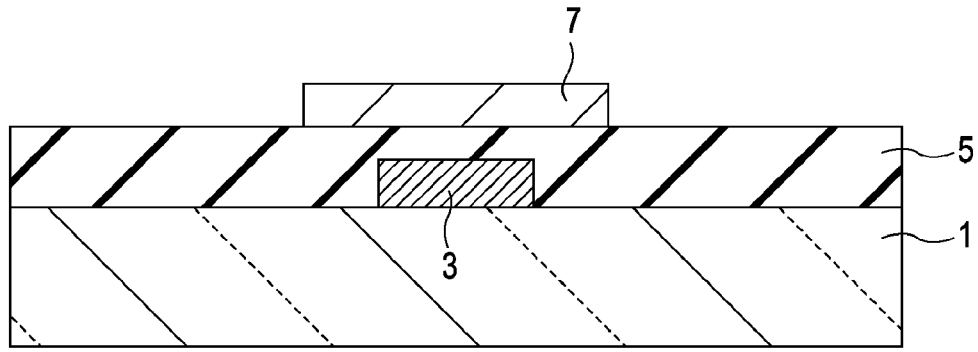
FIGS. 3A to 3J are step diagrams for explaining a manufacturing method according to a third embodiment.

Initially, the configuration as shown in FIG. 3A is obtained, in which a gate insulating film 5 is formed while covering a gate electrode 3 on a substrate 1, and an organic semiconductor layer 7 is patterned into the shape of an island on the resulting gate insulating film 5.

Figure 3B:
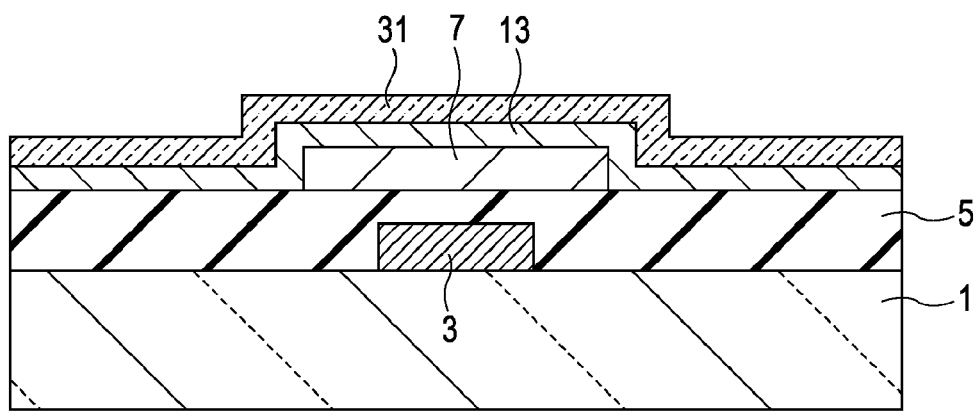

Subsequently, as shown in FIG. 3B, an electrode film 13 having a light-transmitting property is formed all over the surface of the gate insulating film 5 while covering the organic semiconductor layer 7. Furthermore, a mask-forming layer 31 is formed on the electrode film 13.

The electrode film 13 formed here is the same as that in the first embodiment. The material suitable for charge injection is selected depending on whether the thin film transistor to be produced is of p-type channel or n-type channel, and a laminated structure may be employed as necessary.

It is important that the mask-forming layer 31 has a light-transmitting property with respect to the exposure light. The material therefor is specified to be capable of being etched selectively relative to the electrode film 13. Such a mask-forming layer 31 may be formed from an organic material, an inorganic material, an electrically conductive material, or an insulating material.

As an example, in the case where the electrode film 13 is formed from Au, a metal, e.g., Ti or Al, an inorganic insulating material, e.g., $SiO_2$ or SiNx, or an organic insulating material, e.g., PVP or PMMA, is used for the mask-forming layer 31. Regarding these materials, film formation of the inorganic material may be conducted by a sputtering method, a CVD method, or the like, and film formation of the organic insulating material may be conducted by a coating process.

Up to this point, it is important that every layer of from the substrate 1 to the mask-forming layer 31, excluding the gate electrode 3, has a light-transmitting property with respect to the exposure light, and the whole layer, in which these layers are totalized, has a light-transmitting property with respect to the exposure light.

Figure 3C:
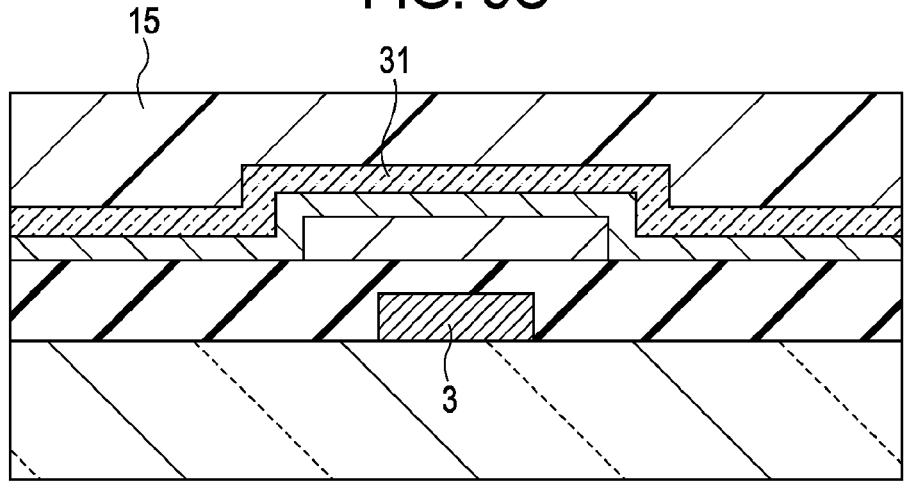

Then, as shown in FIG. 3C, a negative type photoresist film 15 is formed on the mask-forming layer 31. The resulting resist film 15 has at least negative type photosensitivity, as in the first embodiment.

Figure 3D:
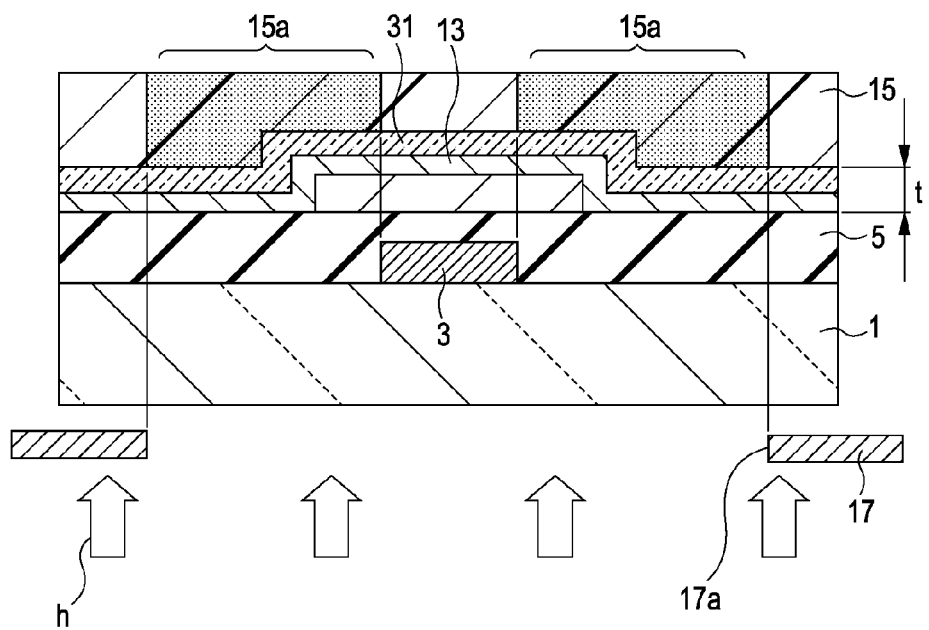
Figure 3E:
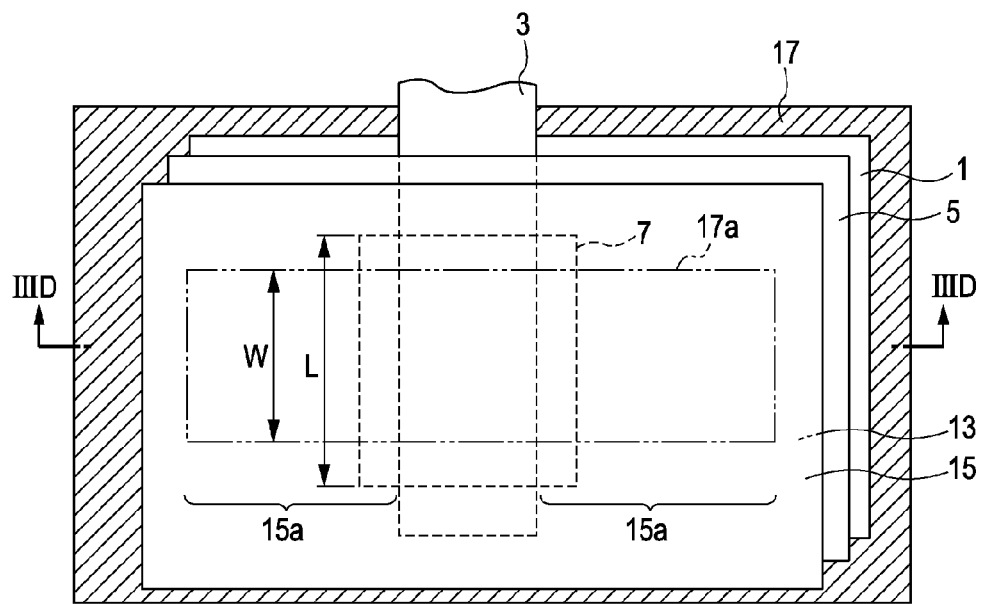

Thereafter, as indicated by a sectional view shown in FIG. 3D of the section taken along a line IIID-IIID in FIG. 3E and a plan view shown in FIG. 3E, back surface exposure is conducted, in which the UV light as the exposure light h from the substrate 1 side is applied to the resist film 15. At this time, an exposure mask 17 is disposed on the substrate 1 side, and the exposure light h is applied through this exposure mask 17. The exposure mask 17 is provided with an opening portion 17a intersecting the gate electrode 3, as in the first embodiment.

In the opening portion 17a of the exposure mask 17, the exposure light h is applied to a portion, which is not light-shielded with the gate electrode 13, of the resist film 15 on the basis of the above-described back surface exposure through the exposure mask 17, so that exposed portions 15a result and the resist material of the exposed portions 15a is cured.

Figure 3F:
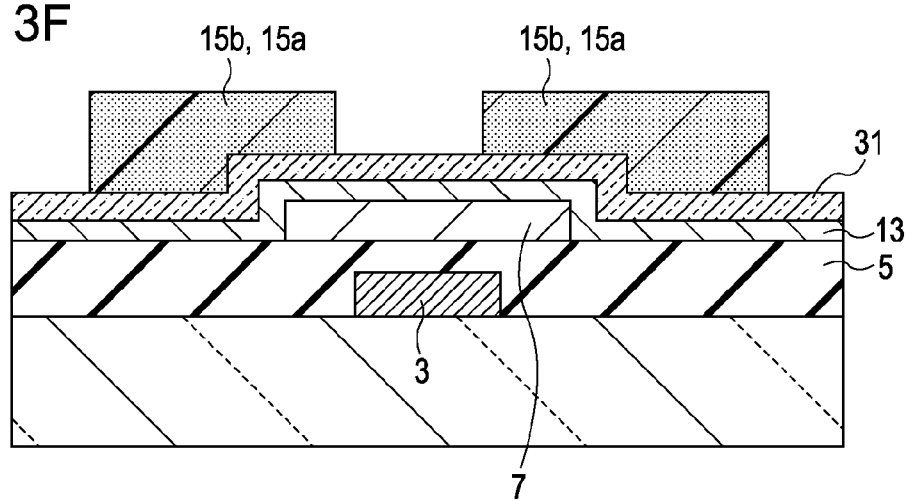

Thereafter, as shown in FIG. 3F, a development treatment of the resist film 15 is conducted and, thereby, merely the exposed portions 15a serving as resist patterns 15b are left on the mask-forming layer 31. The resulting resist patterns 15b are developed through self alignment with respect to the gate electrode 3, as in the first embodiment.

Figure 3G:
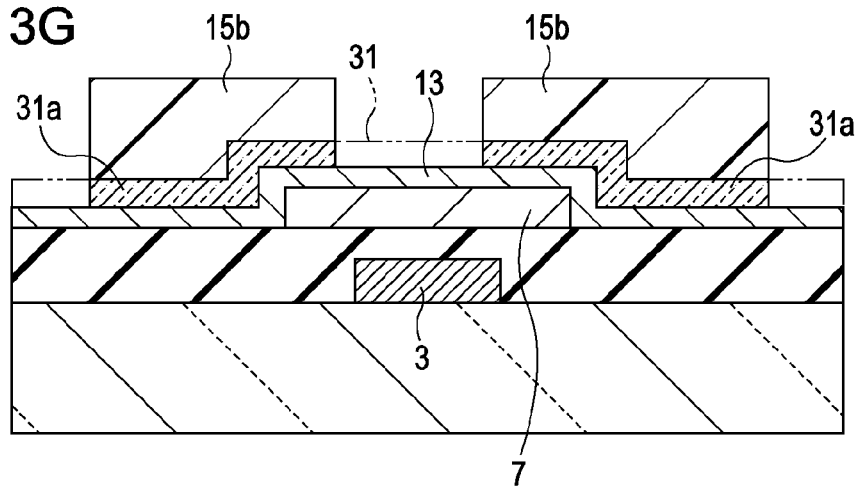

Then, as shown in FIG. 3G, the mask-forming layer 31 is selectively pattern-etched by using the resist patterns 15b as masks. At this time, in the case where the electrode film 13 is Au, the following etching is conducted depending on the materials for the mask-forming layer 31. That is, if the mask-forming layer 31 is Ti, Al, or SiO$_2$, wet etching by using an ammonium fluoride aqueous solution may be conducted. If the mask-forming layer 31 is SiNx, wet etching by using heated phosphoric acid may be conducted. If the mask-forming layer 31 is the organic insulating film material, etching by using oxygen plasma may be conducted.

In this manner, mask patterns 31a produced through etching removal of the mask-forming layer 31 on the gate electrode 3 are formed through self alignment with respect to the gate electrode 3. After the pattern etching, the resist patterns 15b are removed. In this regard, as for the mask patterns 31a, the resist patterns 15b may be used as-is. However, in selective etching of wirings 33 conducted thereafter, a method having a high effect of preventing damage to the organic semiconductor layer 7 serving as a base material may be selected from a wide range by disposing the mask patterns 31a other than the resist patterns 15b.

Figure 3H:
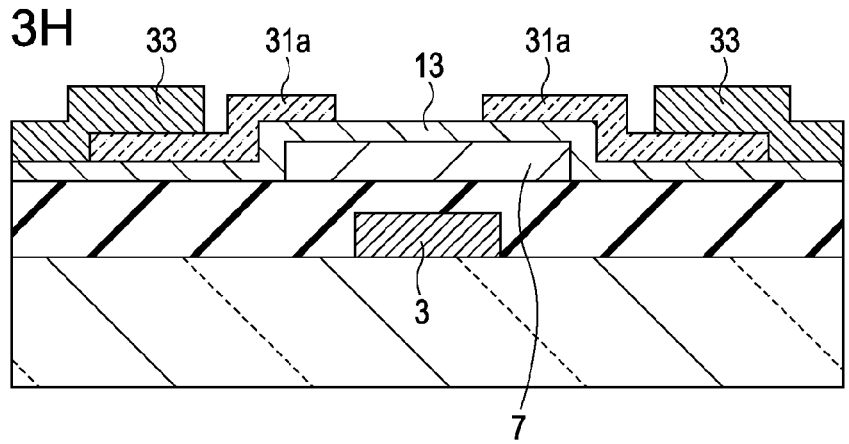

Next, as shown in FIG. 3H, individual wirings 33 are formed on the electrode film 13 on both sides of the gate electrode 3. These wirings 33 are connected to the source and the drain formed from the electrode film 13 and also serve as masks in patterning of the source and the drain. Therefore, it is important that the individual wirings 33 are formed while being laminated on the mask patterns 31a.

The material film constituting the above-described wiring 33 is not necessarily a material capable of injecting charge into the organic semiconductor layer 7 insofar as the material has good electrical conductivity. Therefore, the wiring 33 can be formed by using a more inexpensive material. As for the materials for constituting the wiring 33, AlNd, Cu, Au, Ni, W, Mo, Cr, Ti, Ta, Ag, and the like and laminated films thereof may be used. The method for forming the above-described wiring 33 is not specifically limited, and the formation may be conducted in a manner similar to that of the formation of the gate electrode 3 explained in the first embodiment.

Figure 3I:
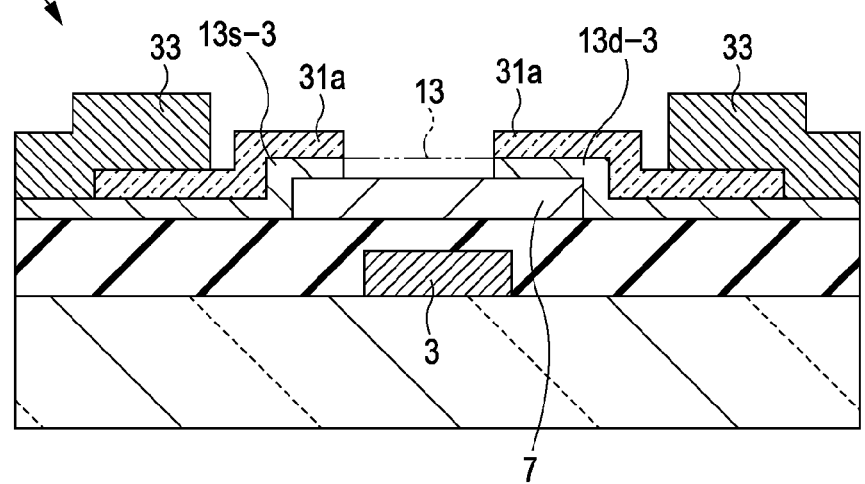
Figure 3J:
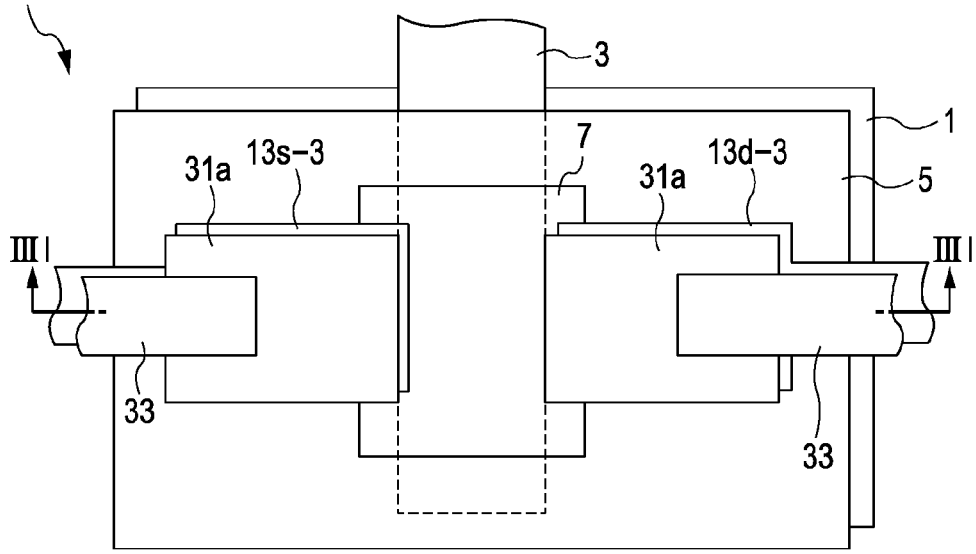

Next, as indicated by a sectional view shown in FIG. 3I of the section taken along a line III I-III I in FIG. 3J and a plan view shown in FIG. 3J, pattern etching of the electrode film 13 is conducted through etching by using the mask patterns 31a and the wirings 33 as masks. Here, in the case where the electrode film 13 is Au and the mask pattern 31a is Ti, Al, SiO$_2$, SiNx, or an organic insulating film material, e.g., PVP or PMMA, wet etching by using an etching solution containing iodine and potassium iodine may be conducted. In this manner, patterning of the electrode film 13 formed from Au may be conducted through selective etching.

In this regard, in the case where the film thickness of the electrode film 13 is sufficiently small relative to the wirings 33, the above-described etching of the electrode film 13 may be conducted at the same time with the etching for forming the wirings 33. Consequently, the steps are simplified.

As described above, the electrode film 13 on the gate electrode 3 is removed through etching, a source 13s-3 and a drain 13d-3 are formed from the electrode film 13 through self alignment with respect to the gate electrode 3, so as to complete a thin film transistor 23-3.

The thin film transistor 23-3 obtained as described above is different from the thin film transistor of the first embodiment in the shapes of the source 13s-3 and the drain 13d-3. That is, the source 13s-3 and the drain 13d-3 are led to the outside of the organic semiconductor layer 7 from the locations opposite to each other above the gate electrode 3 and, furthermore, the source 13s-3 and the drain 13d-3 are disposed as layers under the wirings 33 while having the same pattern shapes as those of the wiring layers 33.

Furthermore, the source 13s-3 and the drain 13d-3 are obtained through etching from above the mask patterns 31a obtained through etching by using the resist patterns 15b as masks, while the resist patterns 15b are formed through self alignment with respect to the gate electrode 3, as in the first embodiment. Therefore, in the above-described third embodiment as well, the source 13s-3 and the drain 13d-3 are disposed, which are registered with respect to the gate electrode 3 through self alignment while end edges thereof are allowed to agree with two end edges of the gate electrode 3 in the width direction. Consequently, as in the first embodiment, a parasitic capacitance between the source 13s-3 and drain 13d-3 and the gate electrode 3 may be suppressed effectively in the thin film transistor having the bottom gate-top contact structure.

4. Fourth Embodiment

FIGS. 4A to 4J are step diagrams for explaining a fourth embodiment according to the present invention. A method for manufacturing a thin film transistor according to the fourth embodiment will be described below with reference to these drawings. The fourth embodiment is a combination of the second embodiment and the third embodiment and, therefore, detailed explanations of the same configurations as those in the above-described first embodiment to the third embodiment will not be provided.

Figure 4A:
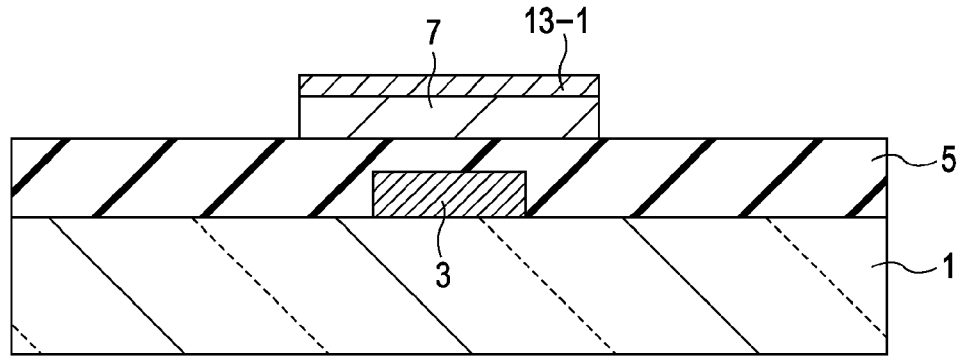
FIGS. 4A to 4J are step diagrams for explaining a manufacturing method according to a fourth embodiment.

Initially, as shown in FIG. 4A, a gate electrode 3 is patterned on a substrate 1, a gate insulating film 5 is formed while covering the gate electrode 3, and a pattern, in which an organic semiconductor layer 7 and a first electrode film 13-1 are laminated, is formed on the resulting gate insulating film 5. Up to this point, every layer, excluding the gate electrode 3, has a light-transmitting property. Furthermore, the first electrode film 13-1 is formed to become a layer serving as a protective film of the organic semiconductor layer 7 and a layer left as-is to serve as a constituent of a thin film transistor.

Figure 4B:
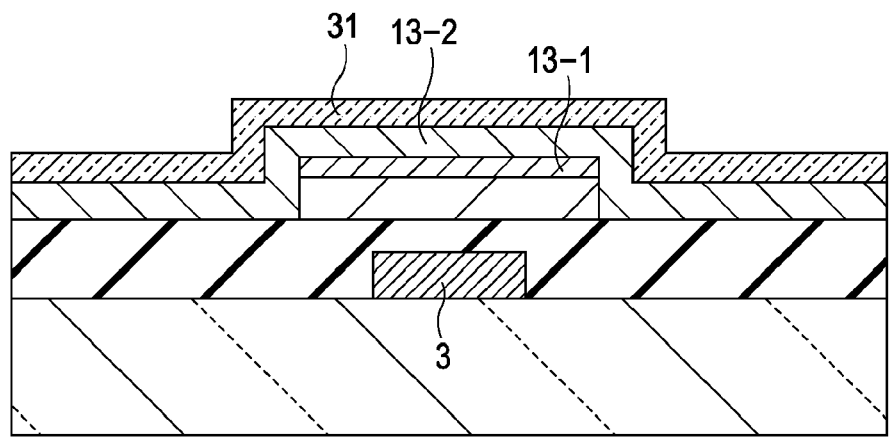

Subsequently, as shown in FIG. 4B, a second electrode film 13-2 having a light-transmitting property is formed all over the surface of the gate insulating film 5 while covering the organic semiconductor layer 7 and the first electrode film 13-1. The second electrode film 13-2 formed here is not necessarily a material capable of injecting charge into the organic semiconductor layer 7, but a more inexpensive electrically conductive material or a highly electrically conductive material may be used. At this time, it is necessary that the first electrode film 13-1 and the second electrode film 13-2 have a light-transmitting property as a whole, and typically, the total film thickness is specified to be 1 nm to 50 nm.

Up to this point, the same procedure as that in the second embodiment may be conducted. In the configuration, it is important that every layer of from the substrate 1 to the second electrode film 13-2, excluding the gate electrode 3, has a light-transmitting property with respect to the exposure light, and the exposure light can be transmitted through the whole layer in which these layers are totalized.

Figure 4C:
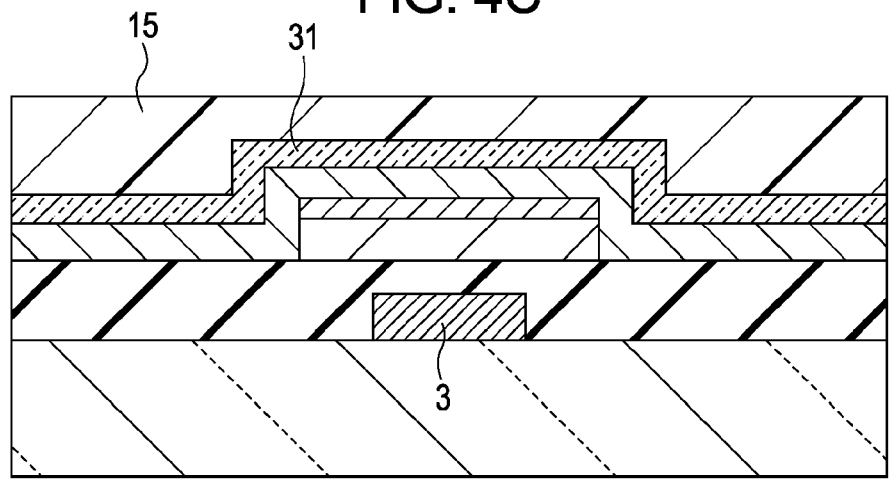

Then, as shown in FIG. 4C, a negative type photoresist film 15 is further formed thereon. The resist film 15 has at least negative type photosensitivity, as in each of the above-described embodiments.

Thereafter, the same procedure as that in the third embodiment may be conducted as described below.

Figure 4D:
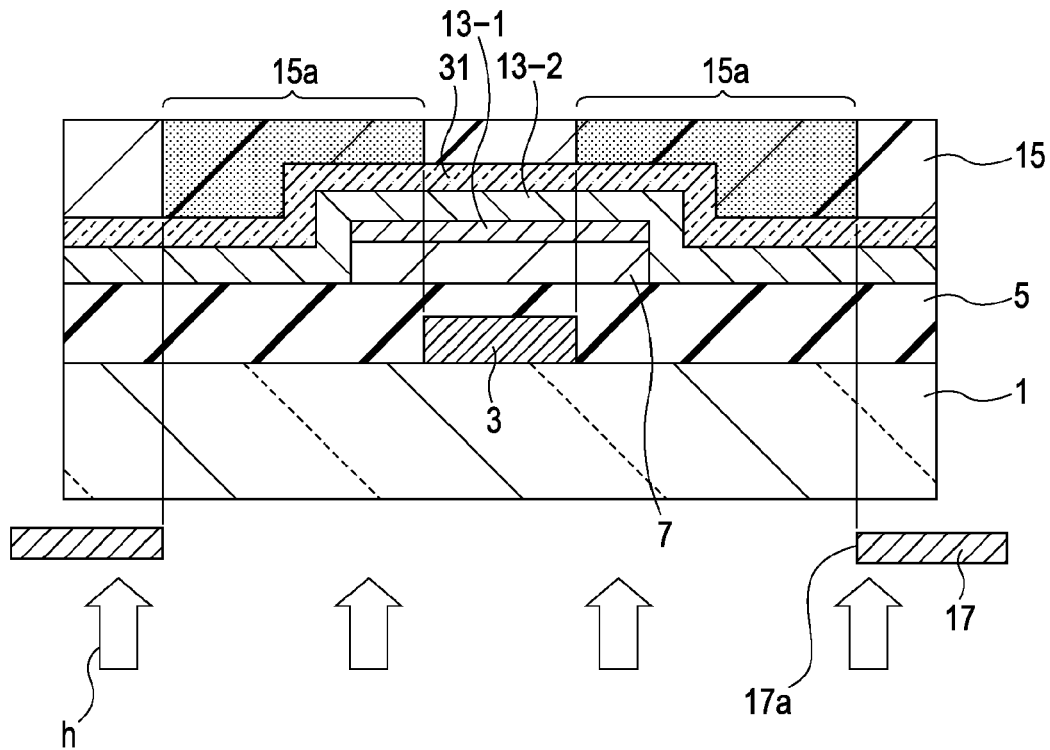
Figure 4E:
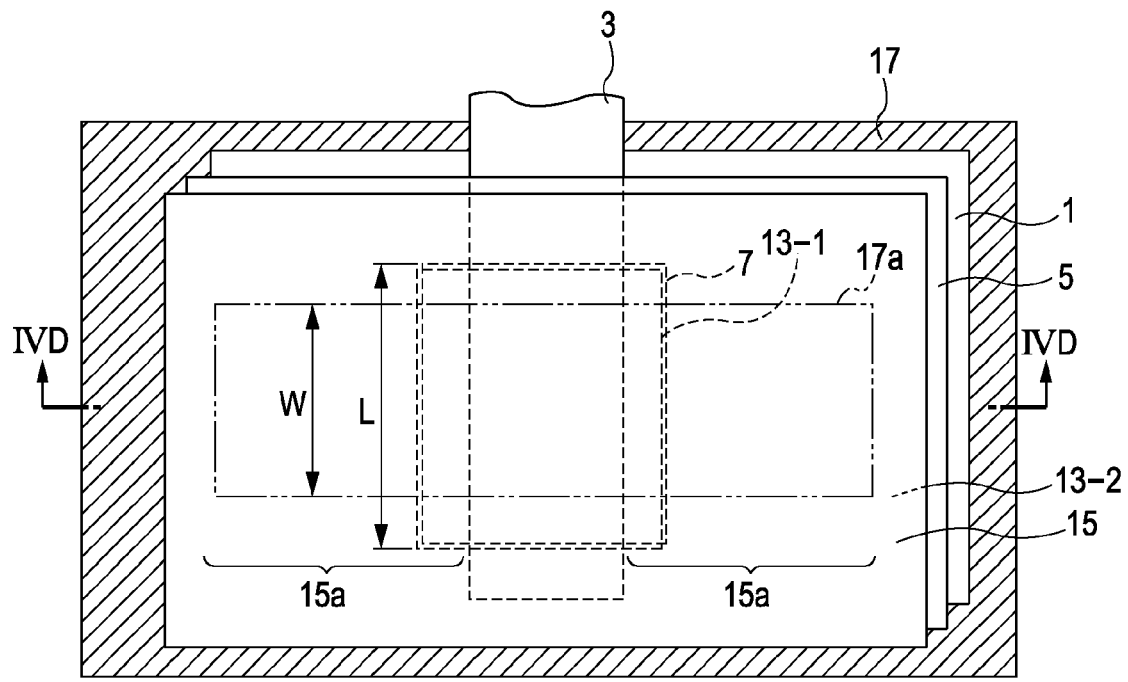

Initially, as indicated by a sectional view shown in FIG. 4D of the section taken along a line IVD-IVD in FIG. 4E and a plan view shown in FIG. 4E, back surface exposure is conducted, in which the UV light as the exposure light h from the substrate 1 side is applied to the resist film 15. At this time, an exposure mask 17 is disposed on the substrate 1 side, and the exposure light h is applied through this exposure mask 17. The exposure mask 17 is provided with an opening portion 17a intersecting the gate electrode 3, as in each of the above-described embodiments.

In the opening portion 17a of the exposure mask 17, the exposure light h is applied to a portion, which is not light-shielded with the gate electrode 13, of the resist film 15 on the basis of the above-described back surface exposure through the exposure mask 17, so that exposed portions 15a result and the resist material of the exposed portions 15a is cured.

Figure 4F:
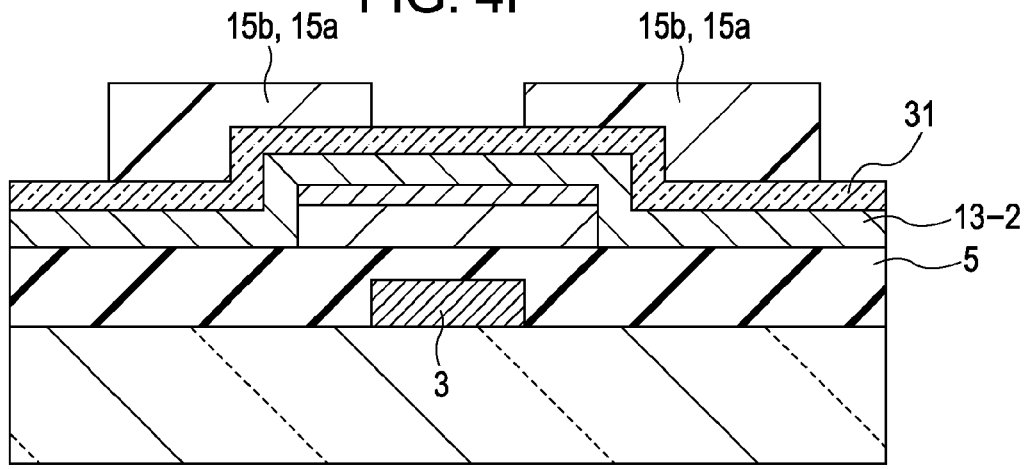

Thereafter, as shown in FIG. 4F, a development treatment of the resist film 15 is conducted and, thereby, merely the exposed portions 15a serving as resist patterns 15b are left on the mask-forming layer 31. The resulting resist patterns 15b are developed through self alignment with respect to the gate electrode 3, as in each of the above-described embodiments.

Figure 4G:
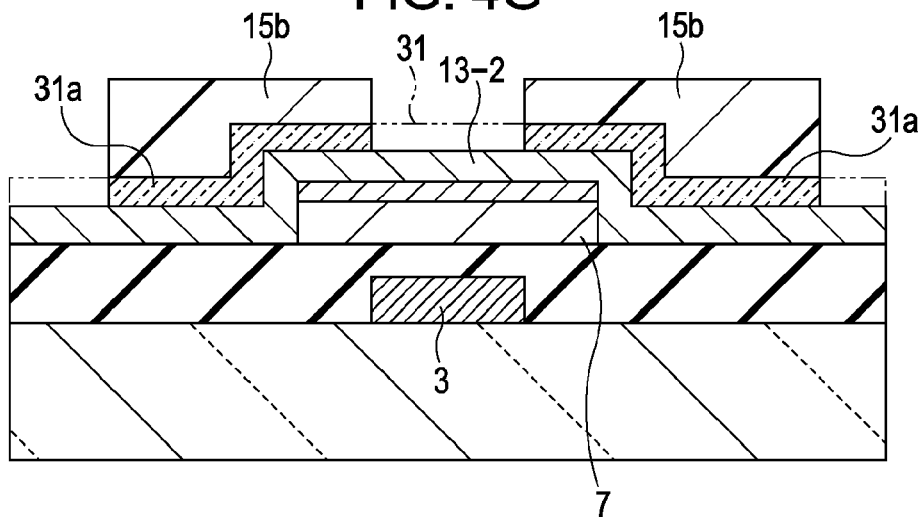

Then, as shown in FIG. 4G, the mask-forming layer 31 is selectively pattern-etched by using the resist patterns 15b as masks. At this time, selective pattern etching of the mask-forming layer 31 is conducted by appropriately selecting the etching method in accordance with the combination of the materials constituting the electrode films 13-1 and 13-2 and the mask-forming layer 31, as in the third embodiment.

In this manner, mask patterns 31a produced through etching removal of the mask-forming layer 31 on the gate electrode 3 are formed through self alignment with respect to the gate electrode 3. After the pattern etching, the resist patterns 15b are removed. In this regard, as for the mask patterns 31a, the resist patterns 15b may be used as-is, as in the third embodiment.

Figure 4H:
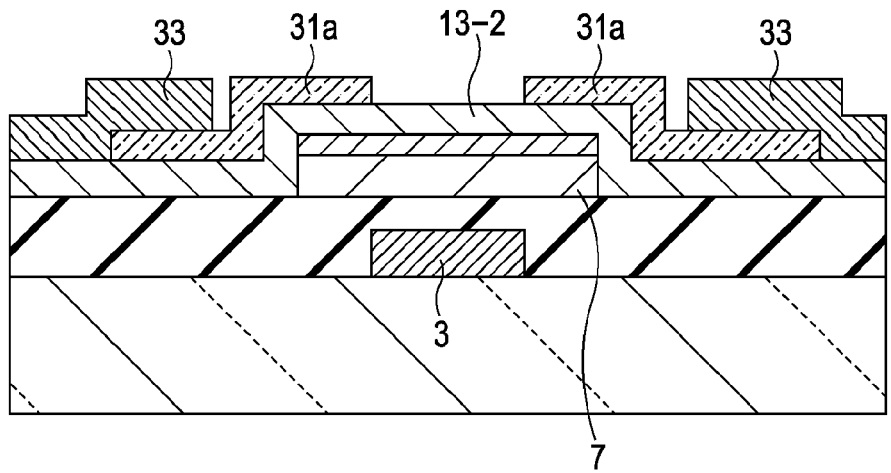

Next, as shown in FIG. 4H, individual wirings 33 are formed on the second electrode film 13-2 on both sides of the gate electrode 3. These wirings 33 are connected to the source and the drain formed from the first electrode film 13-1 and the second electrode film 13-2 and also serve as masks in patterning of the source and the drain. Therefore, it is important that the individual wirings 33 are formed while being laminated on the mask patterns 31a.

The material film constituting the above-described wiring 33 is not necessarily a material capable of injecting charge into the organic semiconductor layer 7 insofar as the material has good electrical conductivity. Therefore, the wiring 33 can be formed by using a more inexpensive material, as in the third embodiment.

Figure 4I:
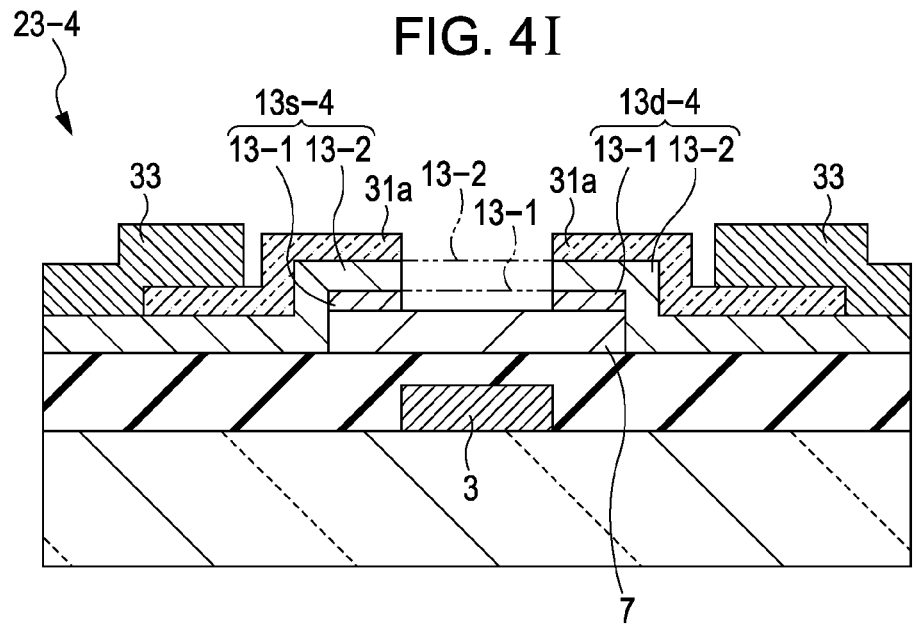
Figure 4J:
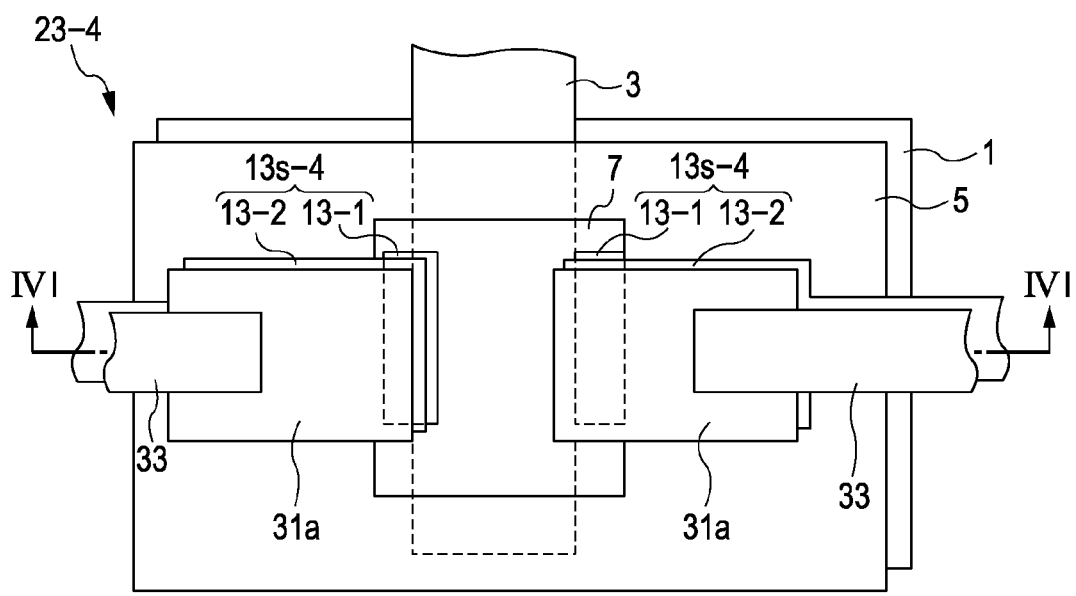

Subsequently, as indicated by a sectional view shown in FIG. 4I of the section taken along a line IV I-IV I in FIG. 4J and a plan view shown in FIG. 4J, pattern etching of the second electrode film 13-2 and the first electrode film 13-1 is conducted through etching by using the mask patterns 31a and the wirings 33 as masks. This etching may be conducted in one step or in two steps, in which a suitable etching method is applied on a step basis, depending on the materials for the second electrode film 13-2 and the first electrode film 13-1.

As described above, a source 13s-4 and a drain 13d-4 are formed from the second electrode film 13-2 and the first electrode film 13-1 through self alignment with respect to the gate electrode 3, so as to complete a thin film transistor 23-4.

The thin film transistor 23-4 obtained as described above is different from the thin film transistor of the first embodiment in the shapes of the source 13s-4 and the drain 13d-4. That is, the source 13s-4 and the drain 13d-4 are configured to have the features of the second embodiment and the third embodiment in combination and have a laminated structure of the first electrode film 13-1 and the second electrode film 13-2 on the organic semiconductor layer 7. Furthermore, the second electrode film 13-2 is disposed as layers under the wirings 33 while having the same pattern shapes as those of the wiring layers 33.

Moreover, the source 13s-4 and the drain 13d-4 are obtained through etching from above the mask patterns 31a obtained through etching by using the resist patterns 15b as masks, while the resist patterns 15b are formed through self alignment with respect to the gate electrode 3, as in the first embodiment. Therefore, in the above-described fourth embodiment as well, the source 13s-4 and the drain 13d-4 are disposed, which are registered with respect to the gate electrode 3 through self alignment while end edges thereof are allowed to agree with two end edges of the gate electrode 3 in the width direction. Consequently, as in the first embodiment, a parasitic capacitance between the source 13s-4 and drain 13d-4 and the gate electrode 3 may be suppressed effectively in the thin film transistor having the bottom gate-top contact structure.

In addition, the source 13s-4 and the drain 13d-4 have the laminated structure of the first electrode film 13-1 and the second electrode film 13-2 on the organic semiconductor layer 7. Consequently, in the case where a material capable of injecting charge into the organic semiconductor layer 7 is used as the first electrode film 13-1, an inexpensive material may be used as the second electrode film 13-2, so that a cost reduction may be facilitated. Furthermore, the first electrode film 13-1 serves as a protective film in patterning of the organic semiconductor layer 7. Therefore, the film quality of the organic semiconductor layer 7 is maintained and the transistor characteristics may be ensured.

5. Fifth Embodiment

FIGS. 5A to 5J are step diagrams for explaining a fifth embodiment according to the present invention. A method for manufacturing a thin film transistor according to the fifth embodiment will be described below with reference to these drawings. In this regard, detailed explanations of the same configurations as those in the above-described first embodiment to the fourth embodiment will not be provided.

Figure 5A:
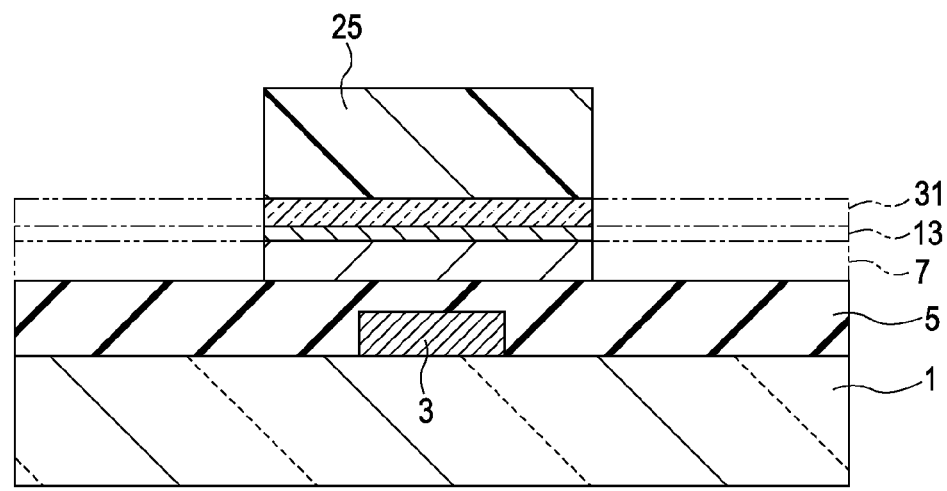
FIGS. 5A to 5J are step diagrams for explaining a manufacturing method according to a fifth embodiment.

Initially, as shown in FIG. 5A, a gate electrode 3 having a light-shielding property is patterned on a substrate 1 having a light-transmitting property with respect to exposure light, and a gate insulating film 5 and an organic semiconductor layer 7, which have a light-transmitting property, are formed while covering them. The procedure up to this point is conducted in a manner similar to that in the first embodiment, and the materials used for the individual layers are the same as those described above.

Subsequently, an electrode film 13 having a light-transmitting property with respect to the exposure light is formed on the resulting organic semiconductor layer 7, and a mask-forming layer 31 is further formed thereon. Each of these layers is the same layer as that explained in the above-described embodiment and it is important to have a light-transmitting property with respect to the exposure light.

Thereafter, a resist pattern 25 is formed on the mask-forming layer 31. The mask-forming layer 31 and the electrode film 13 are pattern-etched by using the resist pattern 25 as a mask. Then, the resist pattern 25 is peeled and the organic semiconductor layer 7 is patterned into the shape of an island covering a part of the gate electrode 3 in the width direction of the gate electrode 3 by using the electrode film 13 as a mask.

Figure 5B:
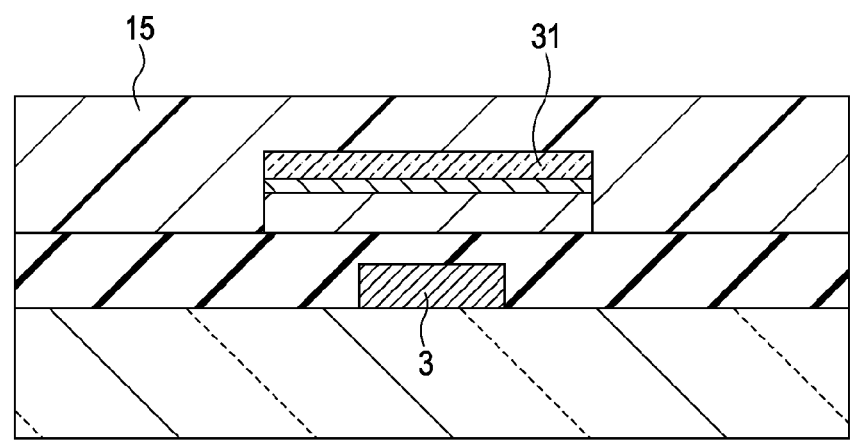

Next, as shown in FIG. 5B, a negative type photoresist film 15 is formed all over the surface of the gate insulating film 5 while covering the organic semiconductor layer 7, the electrode film 13, and the mask-forming layer 31. The resist film 15 has at least negative type photosensitivity, as in the first embodiment.

Figure 5C:
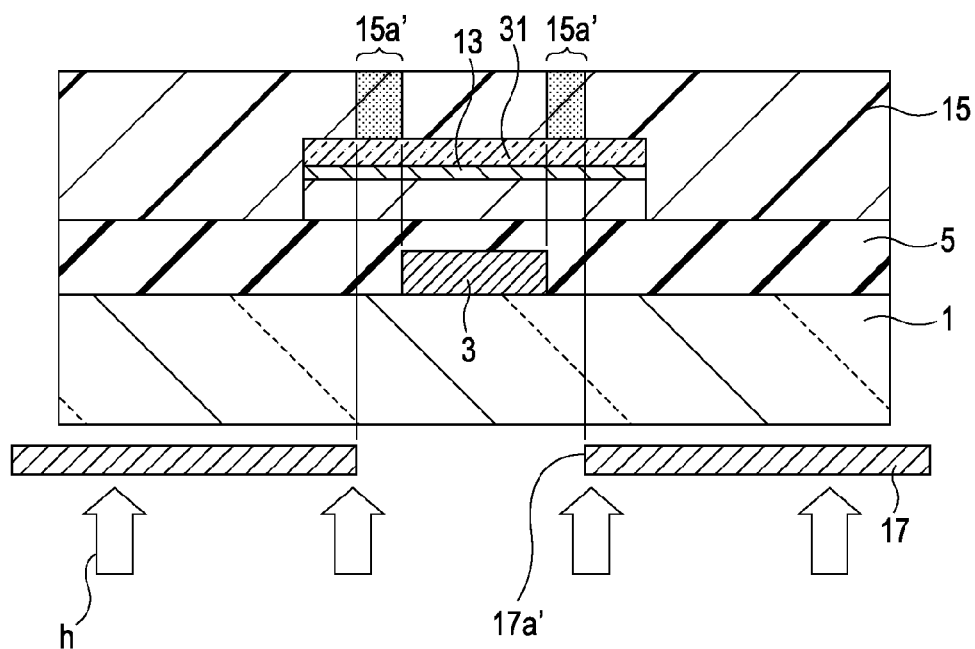
Figure 5D:
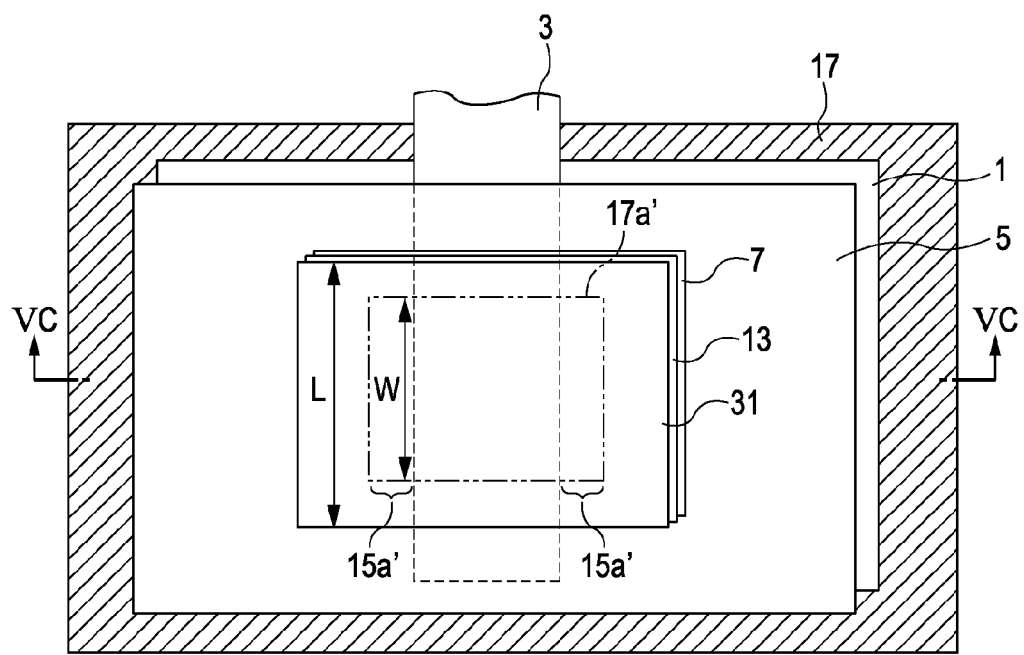

Subsequently, as indicated by a sectional view shown in FIG. 5C of the section taken along a line VC-VC in FIG. 5D and a plan view shown in FIG. 5D, back surface exposure is conducted, in which the UV light as the exposure light h from the substrate 1 side is applied to the resist film 15. At this time, an exposure mask 17 is disposed on the substrate 1 side, and the exposure light h is applied through this exposure mask 17. The exposure mask 17 is provided with an opening portion 17a' intersecting the gate electrode 3, as in the first embodiment. However, in the case where the mask-forming layer 31 is formed from an insulating material, this opening portion 17a' has dimensions of both ends in the direction orthogonal to the extension direction of the gate electrode 3 smaller than those of the mask-forming layer 31.

In the opening portion 17a' of the exposure mask 17, the exposure light h is applied to a portion, which is not light-shielded with the gate electrode 13, of the resist film 15 on the basis of the above-described back surface exposure through the exposure mask 17, so that exposed portions 15a' result and the resist material of the exposed portions 15a' is cured.

Figure 5E:
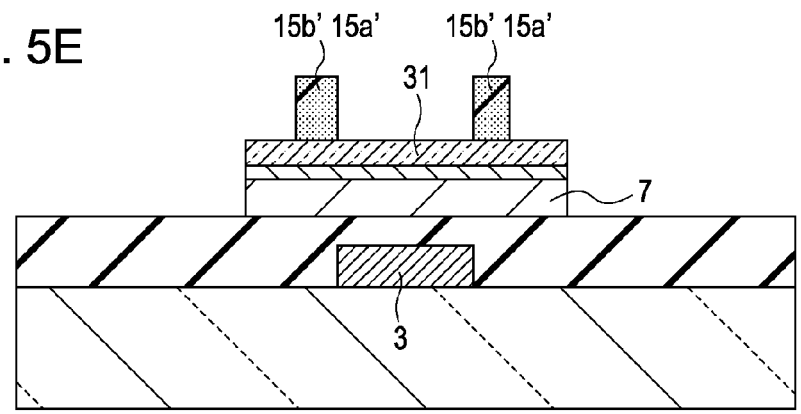

Thereafter, as shown in FIG. 5E, a development treatment of the resist film 15 is conducted and, thereby, merely the exposed portions 15a' serving as resist patterns 15b' are left on the mask-forming layer 31. The resulting resist patterns 15b' are developed through self alignment with respect to the gate electrode 3, as in the first embodiment.

Figure 5F:
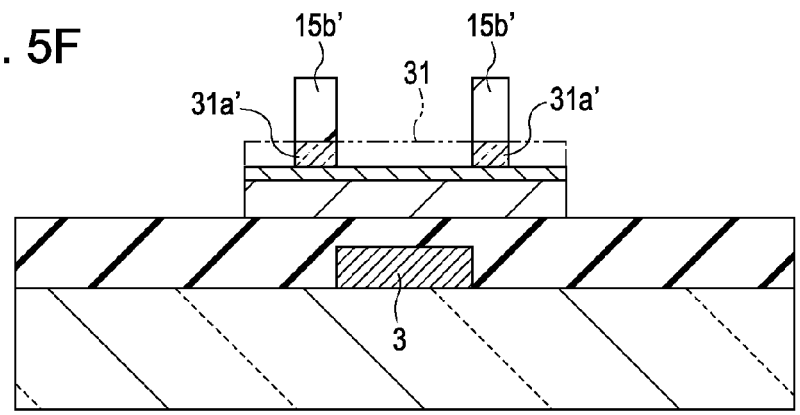
Figure 5G:
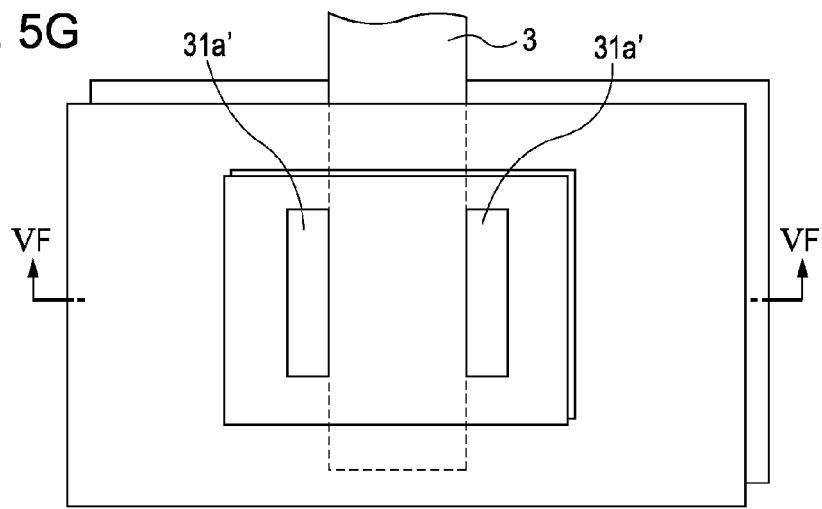

Then, as indicated by a sectional view shown in FIG. 5F of the section taken along a line VF-VF in FIG. 5G and a plan view shown in FIG. 5G, the mask-forming layer 31 is selectively pattern-etched by using the resist patterns 15b' as masks. At this time, appropriate etching is conducted in accordance with the constituent material of the electrode film 13 serving as a base material, as in the third embodiment and the fourth embodiment.

In this manner, mask patterns 31a' produced through etching removal of the mask-forming layer 31 above the gate electrode 3 are formed through self alignment with respect to the gate electrode 3. After the pattern etching, the resist patterns 15b' are removed. In this regard, as for the mask patterns 31a', the resist patterns 15b' may be used as-is, as in the third embodiment and the fourth embodiment.

Figure 5H:
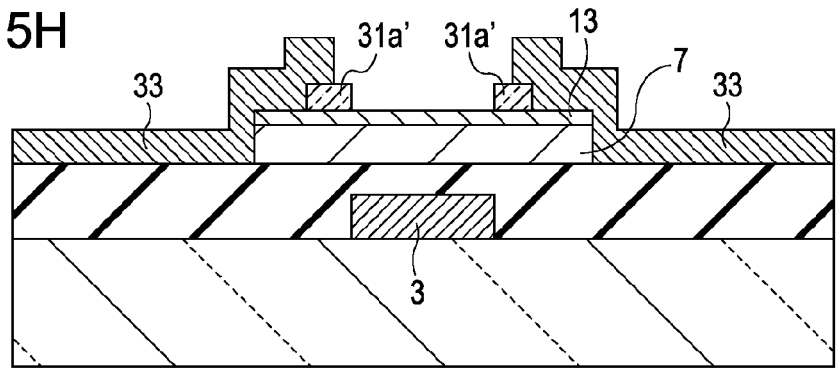

Next, as shown in FIG. 5H, individual wirings 33 are formed on the electrode film 13 on both sides of the gate electrode 3. It is important that these wirings 33 are not laminated on the gate electrode 3, but are laminated on the mask patterns 31a' on both sides of the gate electrode 3.

In this regard, the material film constituting the above-described wiring 33 is not necessarily a material capable of injecting charge into the organic semiconductor layer 7 insofar as the material has good electrical conductivity. Therefore, the wiring 33 can be formed by using a more inexpensive material, as in the third embodiment and the fourth embodiment.

Figure 5I:
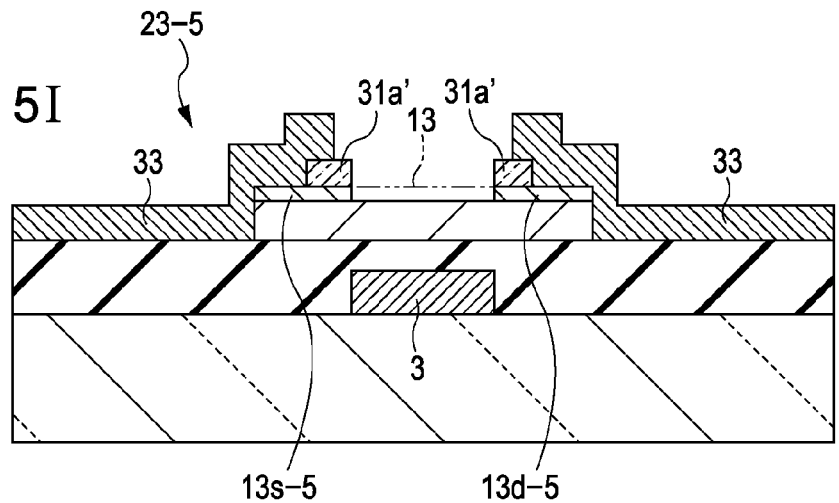
Figure 5J:
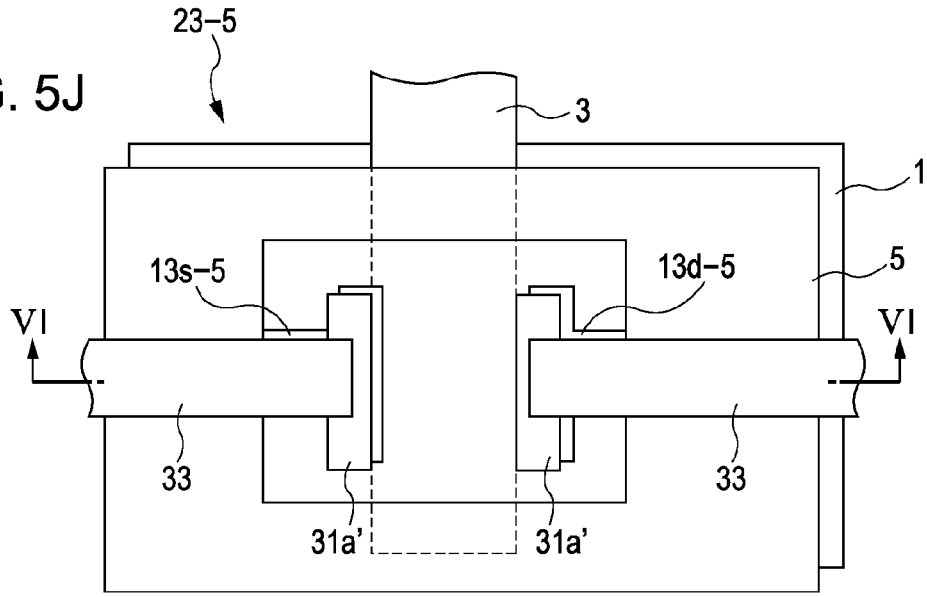

Next, as indicated by a sectional view shown in FIG. 5I of the section taken along a line V I-V I in FIG. 5J and a plan view shown in FIG. 5J, pattern etching of the electrode film 13 is conducted through etching by using the mask patterns 31a' and the wirings 33 as masks. Here, the electrode film 13 may be patterned through selective etching by employing an appropriate etching method in accordance with the constituent material of the electrode film 13 and the mask patterns 31a'.

In this regard, in the case where the film thickness of the electrode film 13 is sufficiently small relative to the wirings 33, the above-described etching of the electrode film 13 may be conducted at the same time with the etching for forming the wirings 33. Consequently, the steps are simplified.

As described above, the electrode film 13 on the gate electrode 3 is removed through etching, a source 13s-5 and a drain 13d-5 are formed from the electrode film 13 through self alignment with respect to the gate electrode 3, so as to complete a thin film transistor 23-5. At this time, in the case where the mask patterns 31a' are formed from an electrically conductive material, the mask patterns 31a' also constitute the source 13s-5 and the drain 13d-5.

The thin film transistor 23-5 obtained as described above is different from the thin film transistors of the above-described other embodiments in the shapes of the source 13s-5 and the drain 13d-5. That is, the source 13s-5 and the drain 13d-5 in the shape of an island are disposed merely on the organic semiconductor layer 7 patterned on the gate electrode 3.

Furthermore, the source 13s-5 and the drain 13d-5 are obtained through etching from above the mask patterns 31a' obtained through etching by using the resist patterns 15b as masks, while the resist patterns 15b are formed through self alignment with respect to the gate electrode 3, as in the first embodiment. Therefore, in the above-described fifth embodiment as well, the source 13s-5 and the drain 13d-5 are disposed, which are registered with respect to the gate electrode 3 through self alignment while end edges thereof are allowed to agree with two end edges of the gate electrode 3 in the width direction. Consequently, as in the first embodiment, a parasitic capacitance between the source 13s-5 and drain 13d-5 and the gate electrode 3 may be suppressed effectively in the thin film transistor having the bottom gate-top contact structure.

Incidentally, the present invention is not limited to the above-described embodiments, and various modifications based on the technical ideas of the present invention may be made. For example, the organic semiconductor layer may have a laminated structure of at least two layers of a high-mobility layer and a layer for absorbing damage due to electrode formation. As for the above-described high-mobility layer, pentacene or CuPc for absorbing damage and the like may be used. Furthermore, the gate insulating film may be etched in patterning of the semiconductor through etching.

Moreover, in the case where the thin film transistor is of p-type channel, an acceptor type charge transfer complex may be disposed between the source and drain and the organic semiconductor layer. On the other hand, in the case where the thin film transistor is of n-type channel, a donor type charge transfer complex may be disposed between the source and drain and the organic semiconductor layer. In addition, in the case where the electrical conductivity of those molecules is not neglected, removal may be conducted through etching with weak energy oxygen plasma or a solvent of the complex molecule after the patterning of the source and the drain.

Furthermore, in the individual steps after formation of the organic semiconductor layer, in order to recover from process damage to the organic semiconductor layer, a step to heat in a low oxygen water vapor atmosphere or in a vacuum may be inserted.

The thin film transistor having the above-described configuration may be favorably used as, for example, an element constituting a pixel circuit or a peripheral circuit in a display device. Regarding the display device, the thin film transistor may be applied to, for example, a display device including an organic electroluminescent element, a liquid crystal display device, and an electrophoretic display device. In addition, the above-described thin film transistor may be applied to various electronic apparatuses, and it is possible to widely apply to electronic apparatuses including the above-described display devices. For example, it is possible to apply to portable terminal units, e.g., electronic papers, digital cameras, note type personal computers, and cellular phones, and electronic apparatuses, e.g., video cameras. That is, it is possible to apply to an electronic apparatus including a display device in almost every field, in which a picture signal input into an electronic apparatus or a picture signal generated in an electronic apparatus is displayed as an image or a picture.

Furthermore, electronic apparatuses according to embodiments of the present invention are not limited to the display devices. It is possible to widely apply to electronic apparatuses in which the above-described thin film transistors are included and electrically conductive patterns (for example, may be a pixel electrode) are connected thereto. For example, it is possible to apply to electronic apparatuses, e.g., ID tags and sensors. Regarding the above-described electronic apparatuses, miniaturized apparatuses can be driven stably by using fine thin film transistors having good characteristics.

The present application contains subject matter related to that disclosed in Japanese Priority Patent Application JP 2009-100434 filed in the Japan Patent Office on Apr. 17, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A thin film transistor comprising:
a substrate;
a gate electrode on the substrate;
a gate insulating film covering the gate electrode;
an organic semiconductor layer disposed on the gate insulating film;
source and drain regions on the organic semiconductor layer and the gate insulating film;
negative type resist layers respectively on the source and drain regions; and
respective electrodes extending to the source and drain regions,
wherein:
end edges of the source and drain regions coincide with two end edges of the gate electrode in a width direction of the gate electrode,
the respective electrodes extending through the resist layers to the source and drain regions, and
end edges of the resist layers coincide with the two end edges of the gate electrode in the width direction of the gate electrode.

2. The thin film transistor according to claim 1, wherein the negative type resist layers have the same pattern shape as that of source and drain regions.

3. The thin film transistor according to claim 1, comprising respective wiring layers patterned on the source and drain regions, a part of each of the source and drain regions having the same pattern as the pattern of the respective wiring layer.

4. The thin film transistor according to claim 3, wherein each of the source and drain regions has a laminated structure comprising a first electrode film d on the organic semiconductor layer and a second electrode film extending from on the first electrode film to on the gate insulating film.

5. The thin film transistor according to claim 1, wherein:
the organic semiconductor layer has an island shape, and
a respective wiring extends from each of the source and drain regions to on the gate insulating film.

6. The thin film transistor of claim 1, wherein the negative resist layers are effective to transmit light.

7. A thin film transistor comprising:
a substrate;
a gate electrode on the substrate;
a gate insulating film covering the gate electrode;
an organic semiconductor layer disposed on the gate insulating film;
source and drain regions on the organic semiconductor layer and the gate insulating film; and
respective electrodes extending to the source and drain regions,
wherein,
end edges of the source and drain regions coincide with two end edges of the gate electrode in a width direction of the gate electrode,
the gate electrode is effective as a light-shielding layer, and
the gate insulating layer and, the source and drain regions are effective to transmit light.

* * * * *